United States Patent [19]
Nakajima

[11] Patent Number: 6,127,694
[45] Date of Patent: Oct. 3, 2000

[54] SEMICONDUCTOR WAFER AND METHOD OF MANUFACTURING THE SAME, AND SEMICONDUCTOR DEVICE AND TEST BOARD OF THE SAME

[75] Inventor: Michio Nakajima, Itami, Japan

[73] Assignee: Mitsubishi Denki Kabushiki Kaisha, Tokyo, Japan

[21] Appl. No.: 08/077,926

[22] Filed: Jun. 18, 1993

[30] Foreign Application Priority Data

Jun. 26, 1992 [JP] Japan ..................................... 4-169358

[51] Int. Cl.[7] .............................. H01L 23/58; H01L 29/00
[52] U.S. Cl. ............................................... 257/48; 257/529
[58] Field of Search .............................. 257/48, 202, 529

[56] References Cited

FOREIGN PATENT DOCUMENTS 2-249982  10/1990  Japan ........................................ 257/48
3-139842   6/1991  Japan ........................................ 257/48

Primary Examiner—Steven H. Loke
Attorney, Agent, or Firm—Oblon, Spivak, McClelland, Maier & Neustadt, P.C.

[57] ABSTRACT

Regarding a semiconductor device, a burn-in board can be standardized in each package. An IC (100) includes a VCC terminal (2), a GND terminal (3), input terminals (4a, 4b), and output terminals (5), and it also includes a burn-in board setting terminal (14). Input signals applied to the input terminals (4a, 4b) are transmitted to gates 16a and 16b of switching circuit (15) and processed in a function block (7). Regardless of the signals applied to the input terminals (4a, 4b), simply applying a test signal to the burn-in board setting terminal (14), a specified logic is applied to the function block (7). Only if a pin arrangement of the VCC terminal (2), the GND terminal (3), and the burn-in board setting terminal (14) is standardized and determined, burn-in can be performed indifferent of another pin arrangement of the input terminals (4a, 4b).

23 Claims, 21 Drawing Sheets

SEMICONDUCTOR WAFER AND METHOD OF MANUFACTURING THE SAME, AND SEMICONDUCTOR DEVICE AND TEST BOARD OF THE SAME

BACKGROUND OF THE INVENTION

1. Field of the Invention

The present invention relates to a test of a semiconductor device and a semiconductor wafer, and more particularly, to [burn-in].

2. Description of the Prior Art

FIG. 21 is a block diagram showing a prior art semiconductor device (referred to as "IC" hereinafter). An IC1 includes a VCC terminal 2, a GND terminal 3, input terminals 4, and output terminals 5. An input signal applied to the input terminal 4 is transmitted via input buffers 6 to a function block 7 and processed therein. The function block 7 applies output signals to the output terminals 5. For simplification, wiring connecting the VCC terminal 2 and the GND terminal 3 with the function block 7 is omitted.

FIG. 22 is a block diagram showing a prior art static burn-in board 9a. In case where the burn-in board 9a is utilized to perform burn-in, the IC1 is incorporated in the burn-in board 9a in a manner of a packaged IC8.

The burn-in board 9a includes a VCC terminal 10 and a GND terminal 11, and IC1 (IC8) has its VCC terminal 2 and GND terminal 3 connected to the VCC terminal 10 and the GND terminal 11 of the burn-in board 9a, respectively. On the other hand, the IC1 (IC8) has its input terminal 4 connected to either the VCC terminal 10 or the GND terminal 11, and its output terminal 5 put in its open state.

In performing burn-in, a potential difference is applied between the VCC terminal 10 and the GND terminal 11 to such an extent that it is higher than that in actual operation and that no element breakdown is caused. This allows stress to be applied to about a half of the whole elements, and in this way, a voltage acceleration test is practiced where early nonconforming articles are rejected in early stage. Simultaneously, a temperature acceleration test where ambient temperature is usually set high is practiced.

FIG. 23 is a block diagram showing a dynamic burn-in board 9b. Unlike the static burn-in board 9a, it additionally includes an a.c. signal terminal 13. Similar to the burn-in board 9a, the IC1 is incorporated in the burn-in board 9b in a manner of the packaged IC8. The IC1 (IC8) has its VCC terminal 2 and GND terminal 3 connected to the VCC terminal 10 and the GND terminal 11 of the burn-in board 9b, respectively, and its output terminal 5 put its open state.

Unlike the burn-in board 9a, part of the input terminal 4 of the IC1 (IC8) is connected not only to the VCC terminal 10 or the GND terminal 11 of the burn-in board 9b but also to the a.c. signal terminal 13. The a.c. signal terminal 13 is connected to an external waveform generator 12. In the dynamic burn-in, the waveform generator 12 is adapted to generate a waveform by which the function block 7 operates more efficiently and to apply the waveform to the part of the input terminal 4 so as to considerably enhance the number of elements to which stress is applied.

As so such a prior art semiconductor device, the number of input pins, an arrangement of them, and an arrangement of the VCC terminal and the GND terminal vary from one kind of packaged products to another. For example, even though they are apparently packaged in completely the same configuration, burn-in must be practiced by connecting a burn-in board to a packaged semiconductor device in different manners among those different kinds of products.

This is why burn-in boards packaged even in the same configuration cannot be standardized, and there is the disadvantage that each product requires a costly burn-in board and waveform generator.

In addition to that, conventional burn-in is practiced to packaged products, and there is the disadvantage that the burn-in cannot be practiced to a wafer having a plurality of chips. Although demand for chip delivery (delivering non-packaged chips to users) is raised to overcome such disadvantage, products in a state of "chips" are insufficient to secure reliability.

SUMMARY OF THE INVENTION

A first aspect of a semiconductor device according to the present invention comprises (a) a semiconductor circuit which is an object of a test, (b) an input terminal receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, and (e) a mode switching circuit interposed between the input terminal and the semiconductor circuit for switching its operation from the test to the ordinary operation. And the mode switching circuit (e-1) applies the input signal received on the input terminal to the semiconductor circuit during the ordinary operation and (e-2) applies a specified fixed value to the semiconductor circuit during the test.

Preferably, the mode switching circuit receives a test signal which is activated during the test and deactivated during the ordinary operation.

Preferably, the input terminal includes first and second input terminals, the specified fixed value includes first and second fixed values, the mode switching circuit includes (e-3) a first gate for outputting the first fixed value regardless of a value of a signal applied to the first input terminal during the test and (e-4) a second gate for outputting the second fixed value regardless of a value of a signal applied to the second input terminal during the test.

Preferably, the test signal takes the first fixed value when activated or otherwise take the second fixed value when deactivated.

Preferably, the first and second fixed values corresponds to logical values "1" and "0", respectively, (e-2-1) the first gate includes a first input end connected to the first input terminal, a second input end receiving the test signal, and an output end outputting a logical product of a logic value applied to the first input end thereof and an inverted logic value of the test signal to the semiconductor circuit, and (e-3-1) the second gate includes a first input end connected to the second input terminal, a second input end receiving the test signal, and an output end outputting a logical sum of logic values of the first and second input ends thereof to the semiconductor circuit.

In a first aspect of a semiconductor device according to the present invention, a mode switching device applies a specified fixed value to a semiconductor circuit regardless of a potential applied to an input terminal during a test. Thus, the test can be appropriately executed regardless of a connection of the input terminal.

Hence, if simply a pin arrangement of a power terminal of the semiconductor device is fixed, a test board can be standardized on the basis of each package.

According to a second aspect of a semiconductor device to the present invention, the input terminal further includes a third input terminal than the first aspect of a semiconductor device, and the semiconductor device further comprises (f) signal generating means interposed between the third input terminal and the semiconductor circuit, for outputting a specified a.c. signal regardless of a value of a signal applied to the third input terminal during the test.

Preferably, the signal generating means includes (f-1) a waveform generator for outputting the specified a.c. signal, (f-2) a selector connected to the waveform generator and receiving the test signal, for applying output from the waveform generator to the semiconductor circuit when the test signal is activated or otherwise applying a signal received on the third input terminal when the test signal is deactivated.

Preferably, the signal generating means further includes (f-3) an oscillator for applying to the waveform generator a basic signal which is a base of the specified a.c. signal during the test.

Preferably, the waveform generator includes a read only memory therein.

In a second aspect of a semiconductor device according to the present invention, signal generating means applies a specified a.c. signal to a semiconductor circuit regardless of a potential applied to an input terminal during a test. Thus, with any terminal of a test board being connected to any input terminal, the test can be appropriately executed, and additionally, the signal generating means which is conventionally required for every function of the device becomes needless. Especially, a waveform suitable to each function of each device can be programmed by incorporating an oscillator and a waveform generator which includes a Read only memory therein.

Hence, externally connecting signal generating means is needless. Additionally, a test of semiconductor devices different in function from each other can be performed in the same test board.

According to a third aspect of a semiconductor device to the present invention, the signal generating means further includes than the second aspect of a semiconductor device, (f-4) confirming means connected between the oscillator and the waveform generator for confirming operations of the oscillator and the waveform generator.

Preferably, the confirming means includes (f-4-1) a first confirming unit for confirming the operation of the waveform generator, and (f-4-2) a second confirming unit for confirming the operation of the oscillator.

Preferably, the first confirming unit (f-4-1-1) applies output of the oscillator to the waveform generator when the test signal is activated and (f-4-1-2) has an external signal terminal for applying an external signal from the outside to the waveform generator when the test signal is deactivated; the waveform generator including a first monitor terminal on which output based upon the external signal is applied.

Preferably, the second confirming unit includes (f-4-2-1) a shift register for sequentially storing outputs of the oscillator when the test signal is activated, and (f-4-2-2) a second monitor terminal for confirming output of the shift register.

In a third aspect of a semiconductor device according to the present invention, confirming means can check operations of both a waveform generator and an oscillator. Moreover, by excluding a semiconductor device to which no a.c. signal required in a test is applied, a highly reliable test can be attained. Especially, a shift register in a second confirming unit applies its output to a second monitor terminal after an edge of an output from the oscillator is detected several times, and therefore, dependability upon the test can be confirmed.

Hence, confirming means checks operation of signal generating means, and consequently, a test of high reliability can be performed.

According to a fourth aspect of a semiconductor device to the present invention, the semiconductor device further comprises than the third aspect of a semiconductor device, (g) a first fuse connected to the power terminal.

Preferably, the semiconductor device further comprises (h) a second fuse connected to the mode switching circuit for allowing the test signal to flow therein.

Preferably, the semiconductor device further comprises (i) a first wiring connected to the second fuse, and (j) a second wiring for transmitting the test signal to the first wiring.

Preferably, the test is burn-in.

In a fourth aspect of a semiconductor device according to the present invention, since predetermined current flowing in a fuse causes fusing thereof, such an undesirable semiconductor device where excessive current flows in a power terminal is naturally not tested, and there is not any particular necessity of the step of removing such a semiconductor device in advance of the test.

Hence, a semiconductor device having a factor in malfunction that excessive current flows therein is naturally excluded from objects of the test.

The power terminal may apply to the semiconductor circuit a potential different from the specified potential during the test, and the semiconductor device may further comprise (k) a voltage detecting circuit connected to the power terminal for outputting the test signal of which activation/deactivation depends upon a potential of the power terminal.

Preferably, the semiconductor device further comprises (l) a test terminal receiving the test signal and having its arrangement fixed.

Hence, a voltage detecting circuit outputs a test signal depending upon a potential of the power terminal, and it is needless providing an new test terminal.

The present invention is also directed to a semiconductor wafer, and a first aspect thereof comprises (a) a plurality of semiconductor devices each of which has (a-1) a semiconductor circuit which is an object of a test, (a-2) an input terminal receiving an input signal to the semiconductor circuit during an ordinary operation, (a-3) an output terminal receiving an output signal from the semiconductor circuit during the ordinary operation, (a-4) a power terminal applying a specified potential to the semiconductor circuit during the ordinary operation, (a-5) a mode switching circuit interposed between the input terminal and the semiconductor circuit and receiving a test signal activated during the test and deactivated during the ordinary operation, for switching its operation depending upon the test signal, and (a-6) a first wiring for applying the test signal to the mode switching circuit, and (b) a second wiring commonly connecting the first wirings of the plurality of semiconductor devices, wherein the mode switching circuit applies (a-5-1) the input signal received on the input terminal to the semiconductor circuit during the ordinary operation, (a-5-2) a specified fixed value to the semiconductor circuit during the test.

Preferably, the first wiring includes a first fuse.

As to a first aspect of a semiconductor wafer according to the present invention, a second wiring commonly connects a first wirings used for applying a test signal to a mode switching circuit throughout a plurality of semiconductor devices, and therefore, the plurality of semiconductor devices in chips can be tested keeping a shape of wafer. Power can be supplied from upon the reverse side of the wafer during the test.

Hence, a plurality of semiconductor devices in chips can be tested, keeping a state of wafer.

According to a second aspect of a semiconductor wafer, which is based upon the first one, the input terminal includes an a.c. signal terminal, the semiconductor wafer further comprising (c) dicing line separating the plurality of semiconductor devices from each other, and (d) signal generating means interposed between the a.c. signal terminal and the semiconductor circuit, outputting a specified a.c. signal regardless of a value of a signal applied to the a.c. signal terminal during the test, and formed in the dicing line.

Preferably, the semiconductor wafer further comprises (e) a second fuse interposed between the signal generating means and the semiconductor circuit.

Preferably, the signal generating means includes (d-1) a waveform generator for outputting the specified a.c. signal, and (d-2) a selector connected to the waveform generator, receiving the test signal, applying to the semiconductor circuit output of the waveform generator when the test signal is activated, and a signal applied to the a.c. signal terminal when the test signal is deactivated, respectively.

Preferably, the signal generating means further includes (d-3) an oscillator for applying a basic signal which is a base of the specified a.c. signal, to the waveform generator during the test.

Preferably, the signal generating means further includes (d-4) confirming means connected between the oscillator and the waveform generator for confirming operations of the oscillator and the waveform generator.

As to a second aspect of a semiconductor wafer according to the present invention, since signal generating means outputs a specified a.c. signal regardless of a value of a signal applied to an a.c. signal terminal during the test, a waveform generator required in each function of the device becomes needless. Additionally, the signal generating means is made in a dicing line, and therefore, a test of a plurality of semiconductor devices in chips can be conducted without degradation of integration. The a.c. signal terminal related to the second aspect of the semiconductor wafer of the present invention is equivalent to the third input terminal in the second aspect of the semiconductor device of the present invention.

The present invention is also directed to a method of manufacturing a semiconductor wafer comprising the steps of (a) forming a plurality of semiconductor devices each of which has (a-1) a semiconductor circuit which is an object of a test, (a-2) an input terminal receiving an input signal to the semiconductor circuit during an ordinary operation, (a-3) an output terminal receiving an output signal from the semiconductor circuit during the ordinary operation, (a-4) a power terminal applying a specified potential to the semiconductor circuit during the ordinary operation, (a-5) a mode switching circuit interposed between the input terminal and the semiconductor circuit and receiving a test signal activated during the test and deactivated during the ordinary operation, for switching its operation depending upon the test signal, and (a-6) a fuse for applying the test signal to the mode switching circuit, (b) forming a test wiring commonly connecting the first wirings of the plurality of semiconductor devices, and (c) conducting the test on the plurality of semiconductor devices, wherein the mode switching circuit applies (a-5-1) the input signal received on the input terminal to the semiconductor circuit during the ordinary operation, (a-5-2) a specified fixed value to the semiconductor circuit during the test.

Preferably, a method of manufacturing a semiconductor wafer further comprises the step of (d) selectively removing the test wiring so that the test wiring remains in a junction of the test wiring and the fuse after the step (c).

Preferably, a method of manufacturing a semiconductor wafer further comprises steps of (f) forming a passivation film on the semiconductor device, and (g) exposing the input terminal and the output terminal.

In a method of manufacturing a semiconductor wafer according to the present invention, since a test wiring is formed so as to connect a fuse applying a test signal to a mode switching circuit commonly throughout a plurality of semiconductor devices, a semiconductor wafer which has a plurality of semiconductor devices in chips tested together can be obtained. The test wiring related to the method of manufacturing a semiconductor wafer according to the present invention is equivalent to the second wiring related to the first aspect of the semiconductor wafer of the present invention. Especially, after the test is executed, no undesirable short-circuit arises in separating the chips from each other because of selective etching of the test wiring. Otherwise, utilizing laser to trim the fuse, no undesired short-circuit arises in separating the chips although steps required in etching a metal wiring on the semiconductor wafer is decreased.

In accordance with a method of manufacturing a semiconductor wafer of the present invention, a test of a plurality of semiconductor devices in chips can be conducted. Especially, providing fuse which is to be trimmed after the end of the test, undesirable short-circuit after dicing can be avoided.

The present invention is also directed to a test board of a semiconductor device, and a first aspect thereof is for conducting a test on a semiconductor device which has (a) a semiconductor circuit which is an object of a test, (b) an input terminal receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, (e) a mode switching circuit interposed between the input terminal and the semiconductor circuit and receiving a test signal to be activated during the test and deactivated during the ordinary operation, for switching its operation depending upon the test signal, and (f) a fuse for applying the test signal to the mode switching circuit, the mode switching circuit (e-1) applying the input signal received on the input terminal to the semiconductor circuit during the ordinary operation, and (e-2) applying a specified fixed value to the semiconductor circuit during the test. And the test board of the semiconductor device comprises a test power terminal for applying a test potential only to the power terminal.

In a first aspect of a test board according to the present invention, a test power terminal applies a test potential only to a power terminal of a semiconductor device, and therefore, an arrangement of other input terminals of the semiconductor device does not affect an execution of the test.

In a second aspect of the present invention, a test board of a semiconductor device is for conducting a test on a semiconductor device which has (a) a semiconductor circuit which is an object of a test, (b) an input terminal receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, (e) a test terminal receiving a test signal activated during the test and deactivated during the ordinary operation, (f) a mode switching circuit interposed between the input terminal and the semiconductor circuit for switching its operation depending upon the test signal, and (g) a fuse for applying the test signal to the mode switching circuit, the mode switching circuit (f-1) applying the input signal received on the input terminal to the semiconductor circuit during the ordinary operation, (f-2) applying a specified fixed value to the semiconductor circuit during the test. And the test board comprises a test power terminal for applying a test potential only to the power terminal and the test terminal.

In a second aspect of a test board according to the present invention, a test power terminal applies a test potential only to a power terminal and a test terminal of the semiconductor device, and therefore, an arrangement of other input terminals of the semiconductor device does not affect an execution of the test.

In first and second aspects of a test board according to the present invention, a test board which requires no input wiring thereon and which is simple and fabricated at low cost can be standardized on the basis of each package.

Accordingly, it is an object of the present invention to provide a semiconductor device in which a test board in each package can be standardized and a process of obtaining the test board, and to provide a semiconductor wafer which can be tested in the state of "wafer" and a manufacturing method suitable therefor.

These and other objects, features, aspects and advantages of the present invention will become more apparent from the following detailed description of the present invention when taken in conjunction with the accompanying drawings.

DESCRIPTION OF THE PREFERRED EMBODIMENT

1st Preferred Embodiment

Figure 1:
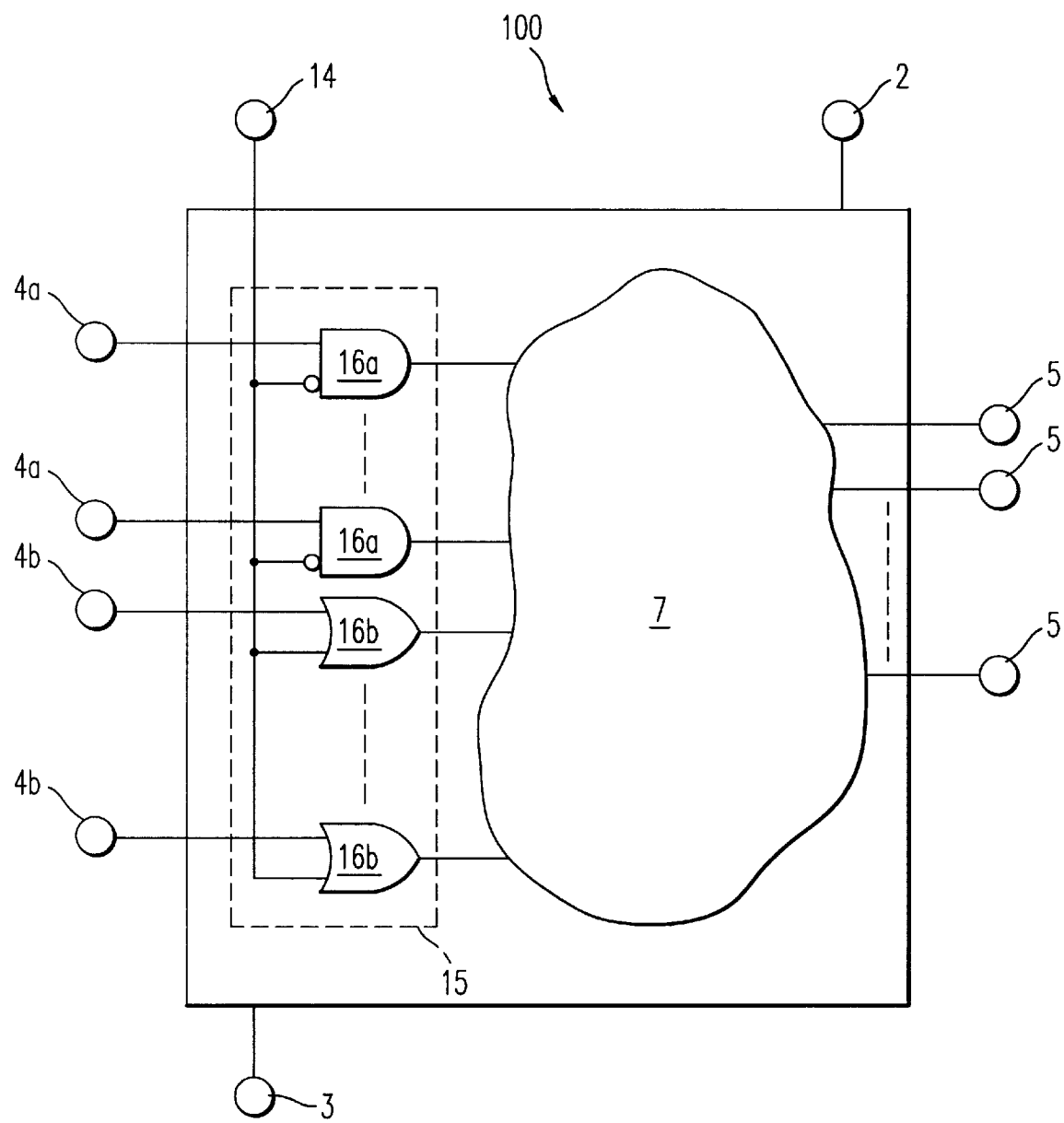
FIGS. 1 and 2 are block diagrams showing a first preferred embodiment according to the present invention.

FIG. 1 is a block diagram showing a structure of an IC100 of a semiconductor device according to the present invention. The IC100 includes a VCC terminal 2, a GND terminal 3, input terminals 4a and 4b, and output terminals 5, and additionally it includes a burn-in board setting terminal 14. Input signals received on the input terminals 4a and 4b are transmitted via a mode switching circuit 15 to a function block 7 to be processed therein. The function block 7 applies output signals to the output terminals 5. For simplification, wiring connecting the VCC terminal 2 and the GND terminal 3 to the function block 7 is omitted.

The mode switching circuit 15 consists of a group of gates 16a each having two inputs connected to the input terminal 4a and the burn-in board setting terminal 14, and a group of gates 16b each having two inputs connected to the input terminal 4b and the burn-in board setting terminal 14.

The burn-in board setting terminal 14 receives a test signal from a burn-in board (mentioned later) for testing the IC100. The test signal assumes a logic High when burn-in is practiced, or otherwise it assumes a logic Low.

Each of the gates 16a performs logic inversion relative to the burn-in board setting terminal 14 and then combines the result with the signal received on the input terminal 4a to make a logical product AND. Hence, in case of practicing burn-in, a logic applied to the input terminal 4a is equivalently fixed in Low to apply it to the function block 7. Each of the gates 16b combines signals received on the burn-in board setting terminal 14 and the input terminal 4b to make a logical sum OR. Hence, in case of practicing burn-in, a logic applied to the input terminal 4b is equivalently fixed in High to apply it to the function bock 7. On the other hand, in case of not practicing burn-in, a signal received on either of the input terminals 4a and 4b, keeping its current logic, is applied to the function block 7.

Figure 2:
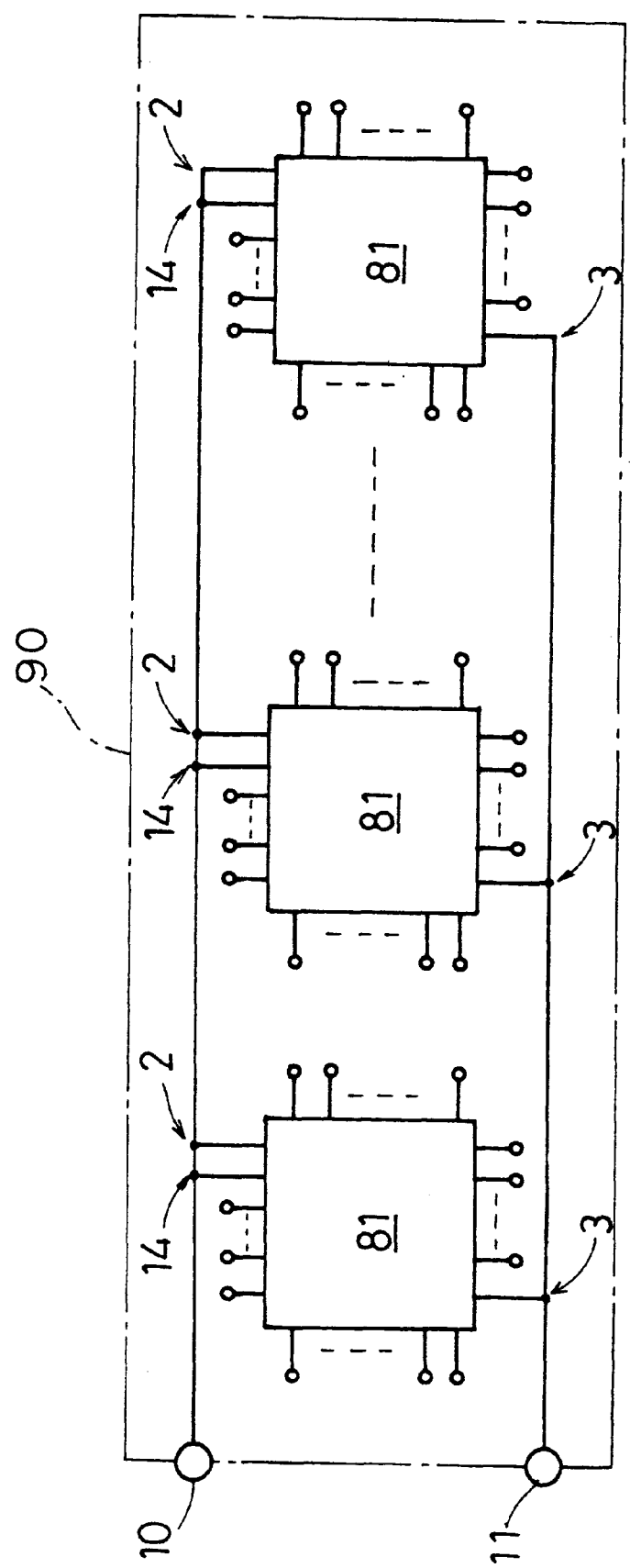

FIG. 2 shows a connection between a burn-in board 90 acting as a test board for a semiconductor device according to the present invention, and IC100 packaging ICs 81. Each of the IC100 (IC81) has its VCC terminal 2 and GND terminal 3 connected to a VCC terminal 10 and a GND terminal 11 of the burn-in board 90, respectively, and its outputs 5 put in their open state. A potential difference applied to the VCC terminal 10 and the GND terminal 11 of the burn-in board 90 is applied so that it is higher than that applied to the VCC terminal 2 and the GND terminal 3 of the IC10 (IC81) in its ordinary use and that no element breakdown is caused while ambient temperature is raised in order to execute a burn-in test.

When the IC100 structured as stated above is subjected to burn-in, merely applying a test signal to the burn-in board setting terminal 14, a specified logic can be applied to the function block 7 regardless of signals received on the input terminals 4a and 4b. Since, regarding the test signal, the logic High is applied, the burn-in board setting terminal 14 is commonly connected to the VCC terminal 2.

Thus, if it is needless that the burn-in board used in practicing burn-in be connected to any input terminal; if merely a pin arrangement of the VCC terminal 2, GND terminal 3 and burn-in board setting terminal 14 of the IC81 is standardized and determined, burn-in is carried out indifferent of another pin arrangement of the input terminals 4a and 4b. Thus, using the IC100, the burn-in board 90 can be standardized in each package.

Moreover, when the IC100 is not subjected to burn-in, signals input to the input terminals 4a and 4b, keeping their current states, are applied to the function block 7, and therefore, it can be used as an ordinary element.

2nd Preferred Embodiment

Figure 3:
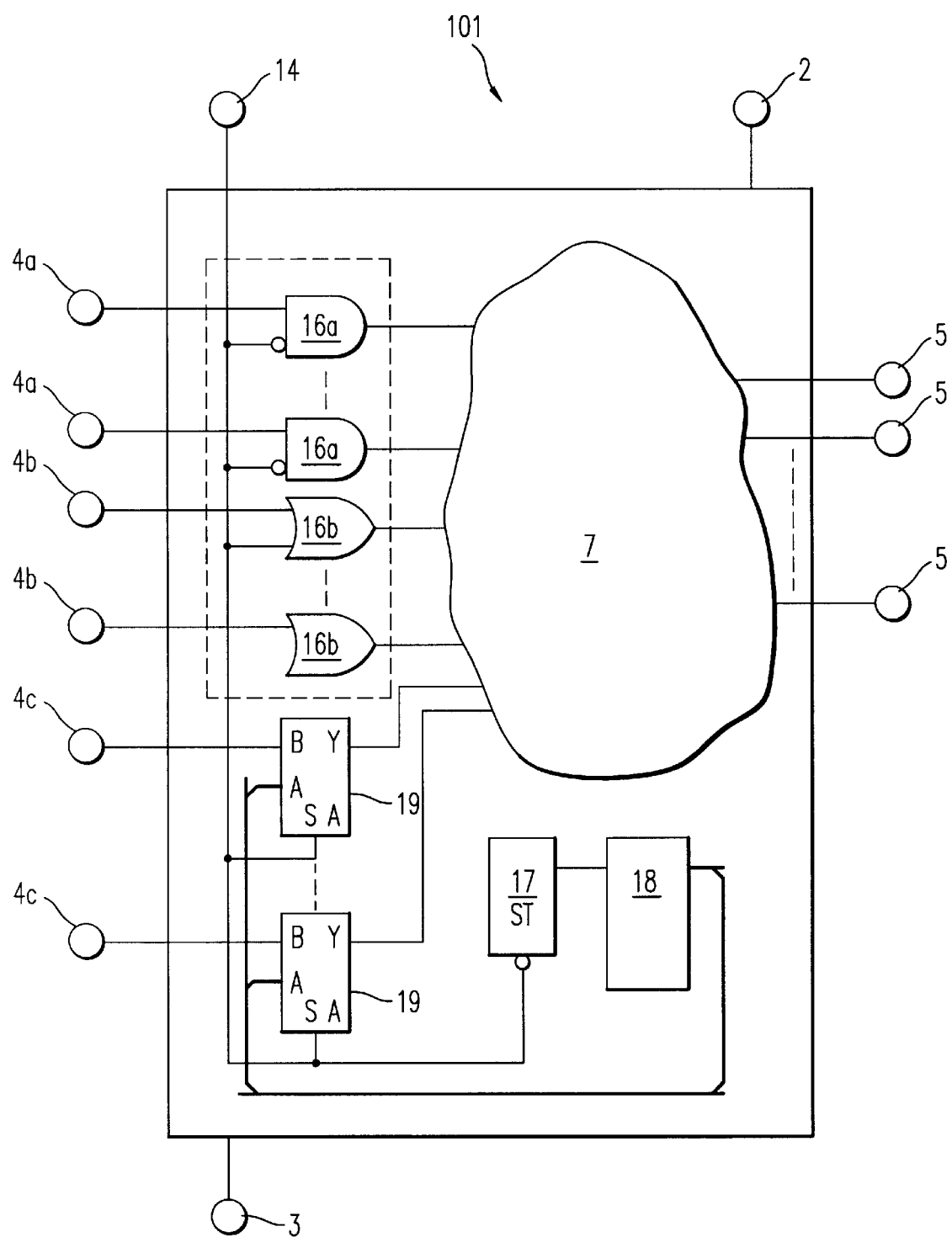
FIGS. 3 and 4 are block diagrams showing a second preferred embodiment according to the present invention.

FIG. 3 is a block diagram showing a structure of an IC101 of a semiconductor device according to the present invention. The IC101 has a structure where an input terminal 4c, an oscillator 17, a waveform generator 18 and a selector 19 are added to components of the IC100 described in the first preferred embodiment.

In FIG. 3, the oscillator 17 stops oscillation when a logic of a test signal received from the burn-in board setting terminal 14 is Low, and it oscillates when the logic is High. The waveform generator 18 receives an output from the oscillator 17 to apply a specified a.c. signal for dynamic burn-in to an A-input of a selector 19. The selector 19 has its B-input connected to the input terminal 4c. The selector 19 selectively outputs an input signal of the input terminal 4c when a logic of the test signal is Low, or a specified a.c. signal output from the waveform generator 18 when the logic is High.

Thus, the IC101 is, when subjected to burn-in similar to the IC100, not only equivalently fixes the logics applied to the input terminals 4a and 4b in Low and High, respectively, to apply them to the function block 7 but applies specified a.c. signal to the function block 7 regardless of the signal received on the input terminal 4c.

As to the IC101 structured as stated above, merely standardizing and determining a pin arrangement of the VCC terminal 2, GND terminal 3 and burn-in board setting terminal 14, dynamic burn-in can be performed indifferent of another pin arrangement of the input terminals 4a, 4b and 4c. Thus, similar to the case of using the IC100, the burn-in board 90 can be standardized in each package. Moreover, since it is needless that a specified a.c. signal is externally introduced in the burn-in board 90, an external terminal and a waveform generator connected thereto are needless. That is, the single burn-in board 90 can be utilized to perform either of static burn-in and dynamic burn-in.

Figure 4:
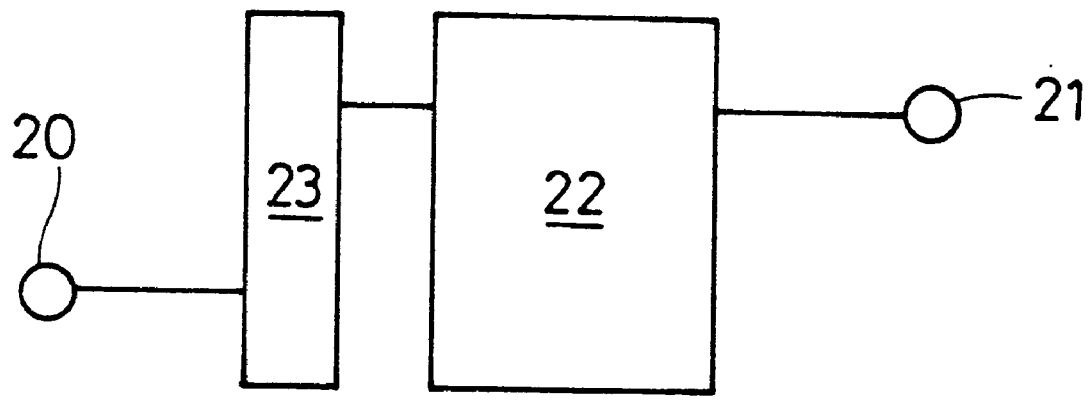

FIG. 4 is a block diagram showing a structure of the waveform generator 18. Output from the oscillator 17 is applied via a clock input terminal 20 to a ROM address generating circuit 23. ROM (Read Only Memory) 22 is connected to a ROM address generating circuit 23 to sequentially apply values stored therein to a ROM output terminal 21 according to addresses specified by the ROM address generating circuit 23.

In this way, the waveform generator 18 including the ROM 22 therein allows a waveform suitable to each of functions of each IC100 to be programmed. Thus, a plurality of the ICs 101 each of which has a function different from others can be simultaneously tested by using the burn-in board 90 if only an identical package is used and if only a pin arrangement of the VCC terminal 2, the GND terminal 3 and the burn-in board setting terminal 14 is standardized and determined.

It is also possible that an clock input is directly applied from the outside to the waveform generator 18, without including the oscillator 17 in the structure.

3rd Preferred Embodiment

Figure 5:
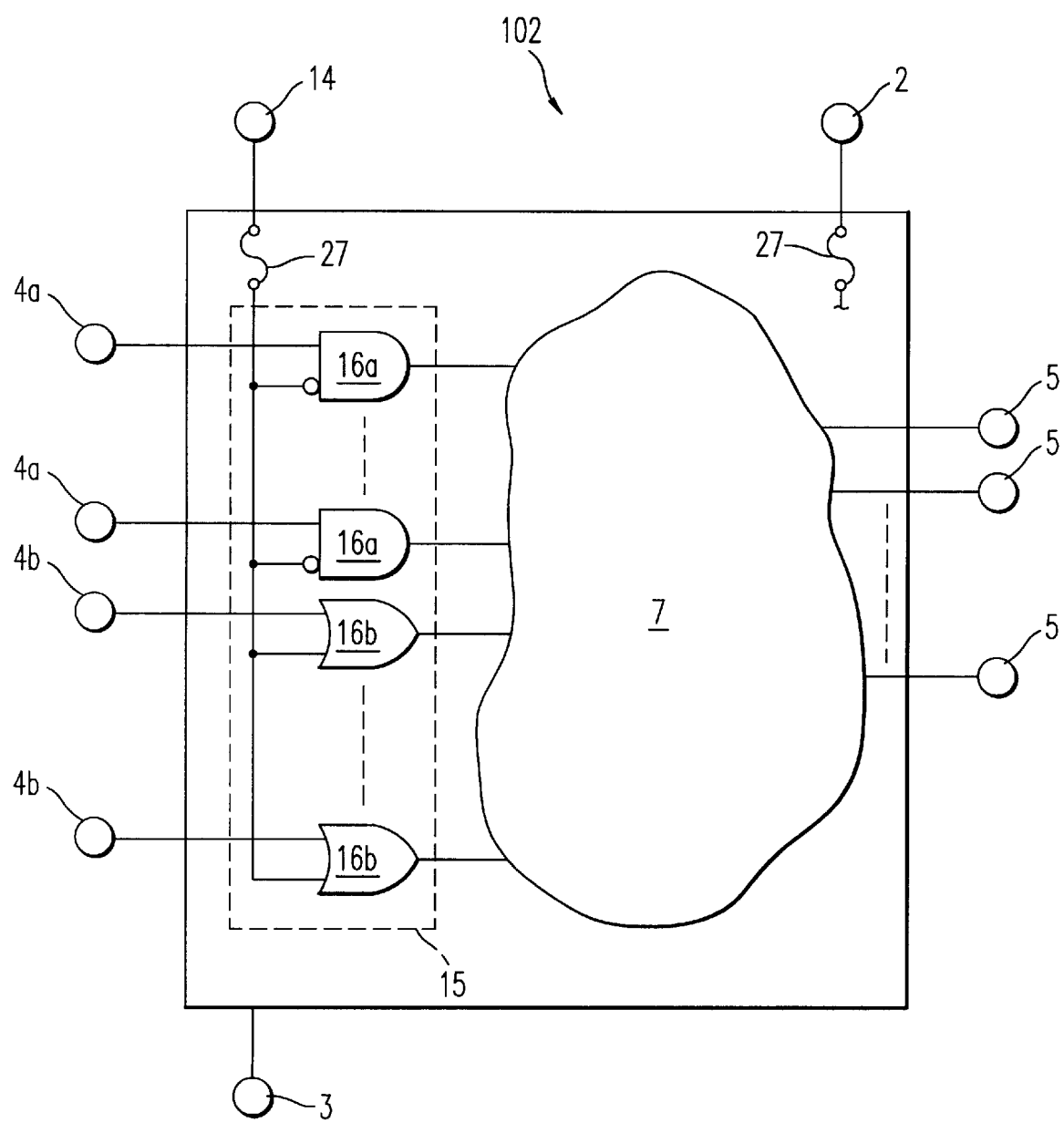
FIG. 5 is a block diagram showing a third preferred embodiment according to the present invention.

FIG. 5 is a block diagram showing a structure of an IC102 of a semiconductor according to the present invention. The IC102 has an arrangement where a fuse 127 is added to the structure of the IC100 described in the first preferred embodiment.

Since the fuse 127 is connected to the VCC terminal 2, given current flowing therein causes fusing, and a potential to be applied from the VCC terminal 2 to the function block 7 is interrupted. Flowing of the given current indicates that there is any factor in causing malfunction by which excessive current is demanded, and such an IC102 does not have to be subjected to burn-in.

Incorporating the fuse 127, the IC102 having any factor in malfunction is naturally excluded, and extra step of removing such a nonconforming IC102 becomes needless.

As explained in the first preferred embodiment, since the burn-in board setting terminal 14 is commonly connected to the VCC terminal 2 during burn-in operation (FIG. 2), providing the fuse 27 between the burn-in board setting terminal 14 and a mode switching circuit as shown in FIG. 5 is helpful in enhancing the effects of the third preferred embodiment.

4th Preferred Embodiment

Figure 6:
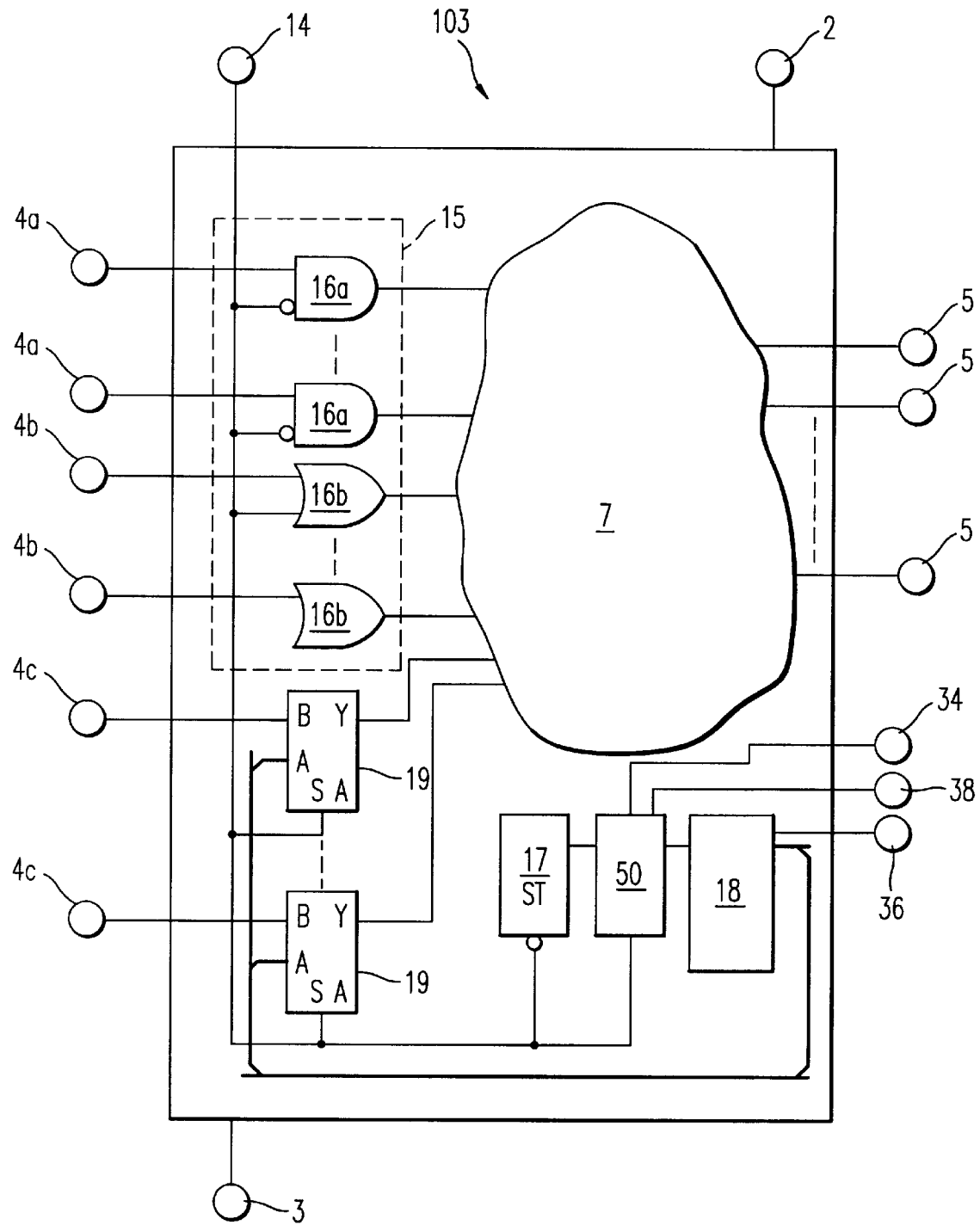
FIGS. 6 and 7 are block diagrams showing a fourth preferred embodiment according to the present invention.

FIG. 6 is a block diagram showing a structure of an IC103 of a semiconductor device according to the present invention. The IC103 has a structure where a check circuit 50, an external clock input terminal 34, an oscillator monitor terminal 38, and a waveform generator monitor terminal 36 are added to the structure of the IC101 explained in the second preferred embodiment.

The check circuit 50 is provided between the oscillator 17 and the waveform generator 18 to check their respective operations, and the results can be confirmed in the oscillator monitor terminal 38 and the waveform generator monitor terminal 36, respectively.

Figure 7:
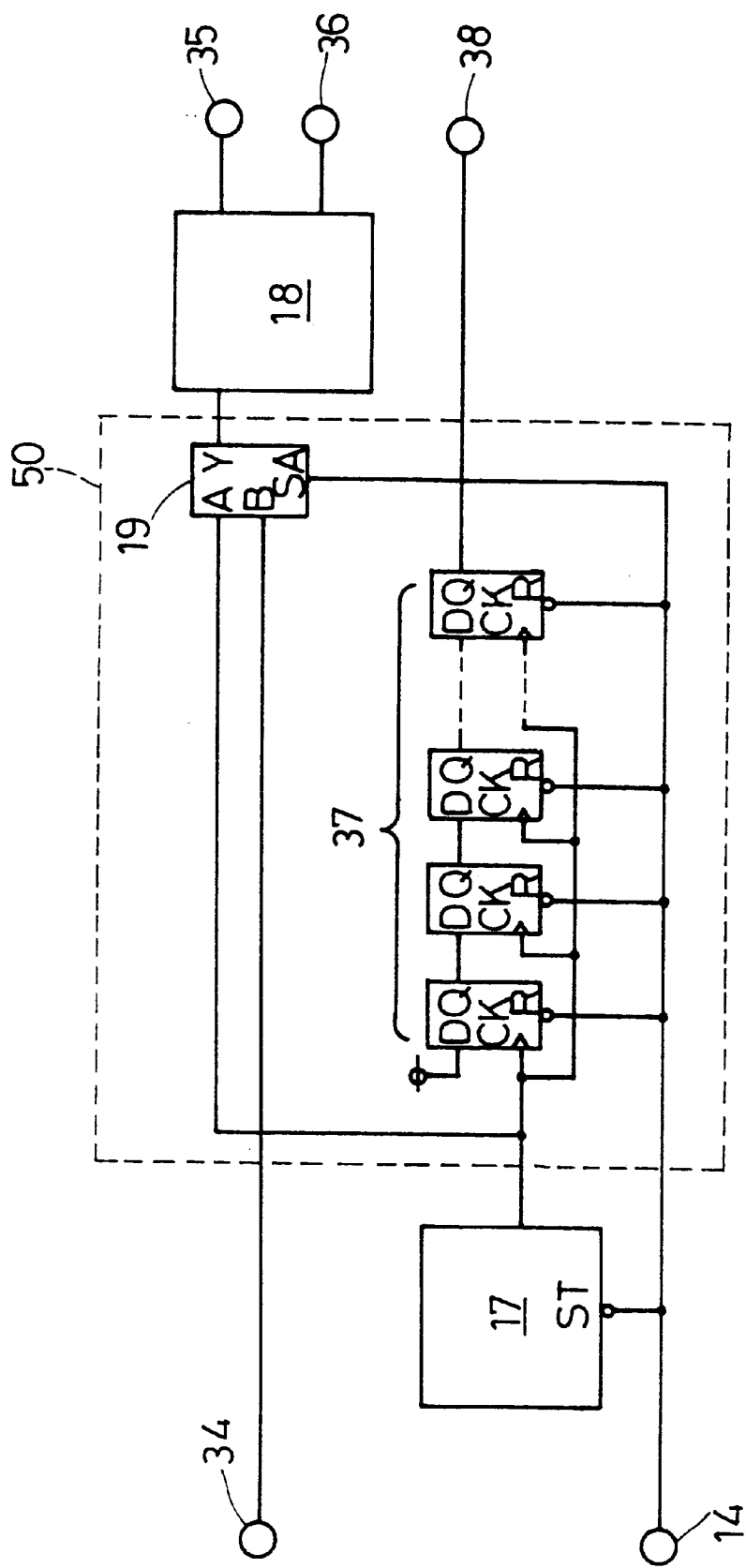

FIG. 7 is a block diagram showing a connection relation among the check circuit 50, the oscillator 17, the waveform generator 18 and their surroundings. The check circuit 50 consists of the selector 19 and a n-stage shift register 37. The selector 19 has its B-input and A-input connected to the external clock input terminal 34 and the oscillator 17, respectively, and its Y-output is connected to the waveform generator 18. The shift register 37 is comprised of flip flops in multi-stage serial connection between the oscillator 17 and the oscillator monitor terminal 38. The waveform generator monitor terminal 36 is connected to the waveform generator 18.

If a logic of a test signal applied to the burn-in board setting terminal 14 is High, burn-in is conducted and an operation of the oscillator 17 is checked, or if the logic is Low, an ordinary operation is conducted and an operation of the waveform generator 18 is checked.

First, when the logic of the burn-in board setting terminal 14 is Low, the selector 19 selects its B-input to apply an external clock received on the external clock input terminal 34 to the waveform generator 18. In synchronization with the external clock, the waveform generator 18 operates. Thus, the operation of the waveform generator 18 can be confirmed in the waveform generator monitor terminal 36 by externally connecting a tester to the external clock input terminal 34 when burn-in is not performed.

Since, as a matter of fact, it is not necessary to make the waveform generator 18 work when the 1C103 is used as an ordinary element, the external clock may not be applied to the external clock input terminal 34.

Then, if the logic of the test signal applied to the burn-in board setting terminal 14 becomes High, the selector 19 selects its A-input to apply an output from the oscillator 17 to the waveform generator 18. However, when the logic of the test signal is Low, the oscillator 17 stops, the shift register 37 is initialized, and the oscillator monitor terminal 38 outputs a Low level. When the logic of the test signal changes from Low to High, the oscillator 17 start working, and a logic of a first stage flip flop changes from Low to High in accordance with a first rising edge of output from the oscillator.

At a second rising of the output from the oscillator 17, a logic High propagates to a second stage flip flop, and a n-th rising of the output from the oscillator 17, the logic High propagates to a n-th stage (final stage) flip flop. The oscillator monitor terminal 38 changes from Low to High. Thus, monitoring a logic of the oscillator monitor terminal 38, it can be confirmed whether the operation of the oscillator 17 is acceptable depending upon if the logic High appears after a corresponding period of time elapses.

As the shift register 37 is comprised of larger stages of flip flops, acceptance/rejection of the oscillator can be detected more assuredly, but it is also possible to reduce the number of stages based upon past experience.

In burn-in, the waveform oscillator 18 generates a specified a.c. signal from its output terminal 35 to apply it to the function block 7.

5th Preferred Embodiment

In the first through fourth preferred embodiments, embodiments about burn-in after a semiconductor device is packaged have been described. However, as to the semiconductor wafer according to the present invention, it can be subjected to burn-in in a state of chip. First, a case where an IC102a having a structure similar to that of the 1C102 described in the third preferred embodiment is formed in a semiconductor wafer 24 will be described. The difference between the IC102a and IC102 will also be described later.

Figure 8:
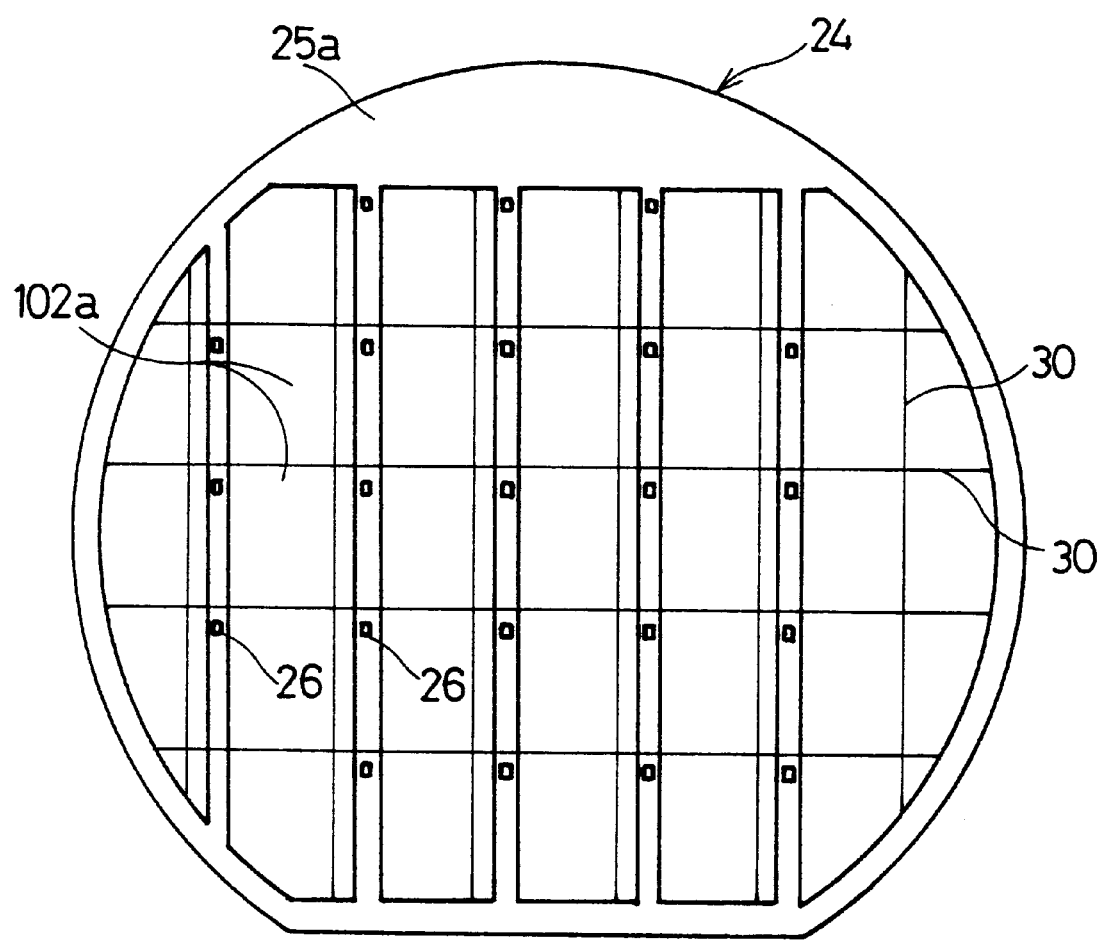
FIGS. 8 and 9 are plan views showing a fifth preferred embodiment according to the present invention.

FIG. 8 is a schematic diagram showing a structure of the semiconductor wafer 24 according to the present invention. On the semiconductor wafer 24, a plurality of ICs 102a are formed, separated from each other by dicing line 30. In the semiconductor wafer 24, a metal wiring 25a is formed on a surface where the ICs 102a are formed, as shown in FIG. 8. Each of the ICs 102a has no burn-in board setting terminal 14 compared with the IC102 but has the metal wiring 25a. The metal wiring 25a corresponds to the burn-in board setting terminal 14 described in FIG. 5 and receives a test signal. The metal wiring 25a is commonly connected via a contact hole 26 to the plurality of ICs 102a.

Figure 9:
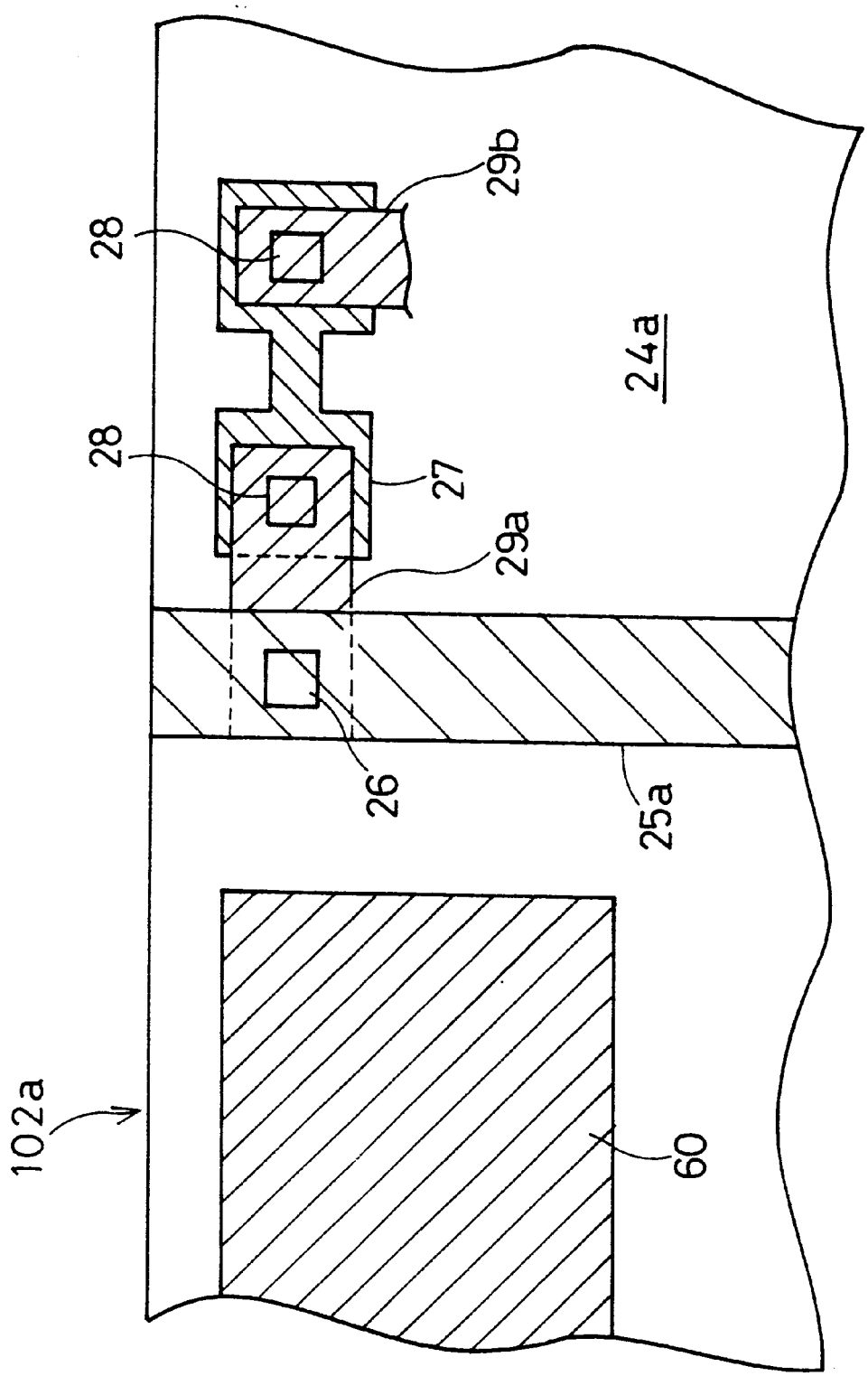

In FIG. 9, an enlarged view of the contact hole 26 and the vicinity thereof is shown to illustrate a connection relation between the metal wiring 25a and the IC102. The metal wiring 25a is connected via a wiring 29a to the fuse 27. A potential VCC developed in a chip is applied via a wiring 29a to the fuse 27. Connection between the metal wiring 25a and the wiring 29a is in the contact hole 26 while connection of opposite terminals of the fuse 27 is in the contact hole 28.

A pad 60 is an electrode equivalent to the input terminals 4a and 4b and the output terminals 5 shown in FIG. 5. The wirings 29a and 29b, the fuse 27, and the pad 60 are formed in one side of a substrate 24a of the semiconductor wafer 24, which together constitutes part of the IC102a.

Referring back to FIG. 8, the metal wiring 25a commonly connects the ICs 102a all formed in the semiconductor wafer 24, and therefore, a test signal may be applied anywhere in the metal wiring 95a. Other fixed potential may be applied to the other (reverse) side of the substrate 24a. It is possible to practice such an operation if a stage where the semiconductor wafer 24 is mounted is conductive.

For example, if the substrate 24a is a P-substrate, potential VCC may be applied to the metal wiring 25a and potential GND (the earth) may be applied to the substrate 24a from the reverse side. If the substrate 24a is an N-substrate, potentials applied them may be reversed.

Thus, the ICs 102a in the semiconductor wafer 24 is subjected to burn-in in the state of chip, that is, without being packaged. After the burn-in, those ICs 102a are separated from each other because of the cutting along the dicing line 30. As a result, since the wiring line 25a is exposed at a cross section of each IC102a, undesirable short-circuit caused by the wiring 25a is in prospect. To avoid this, a path between the IC102a and the wiring 25a can be interrupted by cutting the fuse 27.

Using laser to cut the fuse 27 (for trimming), the trimming can be carried out without increasing a process of metal etching. The fuse 27 may be placed on the dicing line 30.

6th Preferred Embodiment

A semiconductor wafer according to the present invention can be applied to a case where the oscillator 17 and the waveform generator 18 of the IC101 as described in the second preferred embodiment are further provided.

Figure 10:
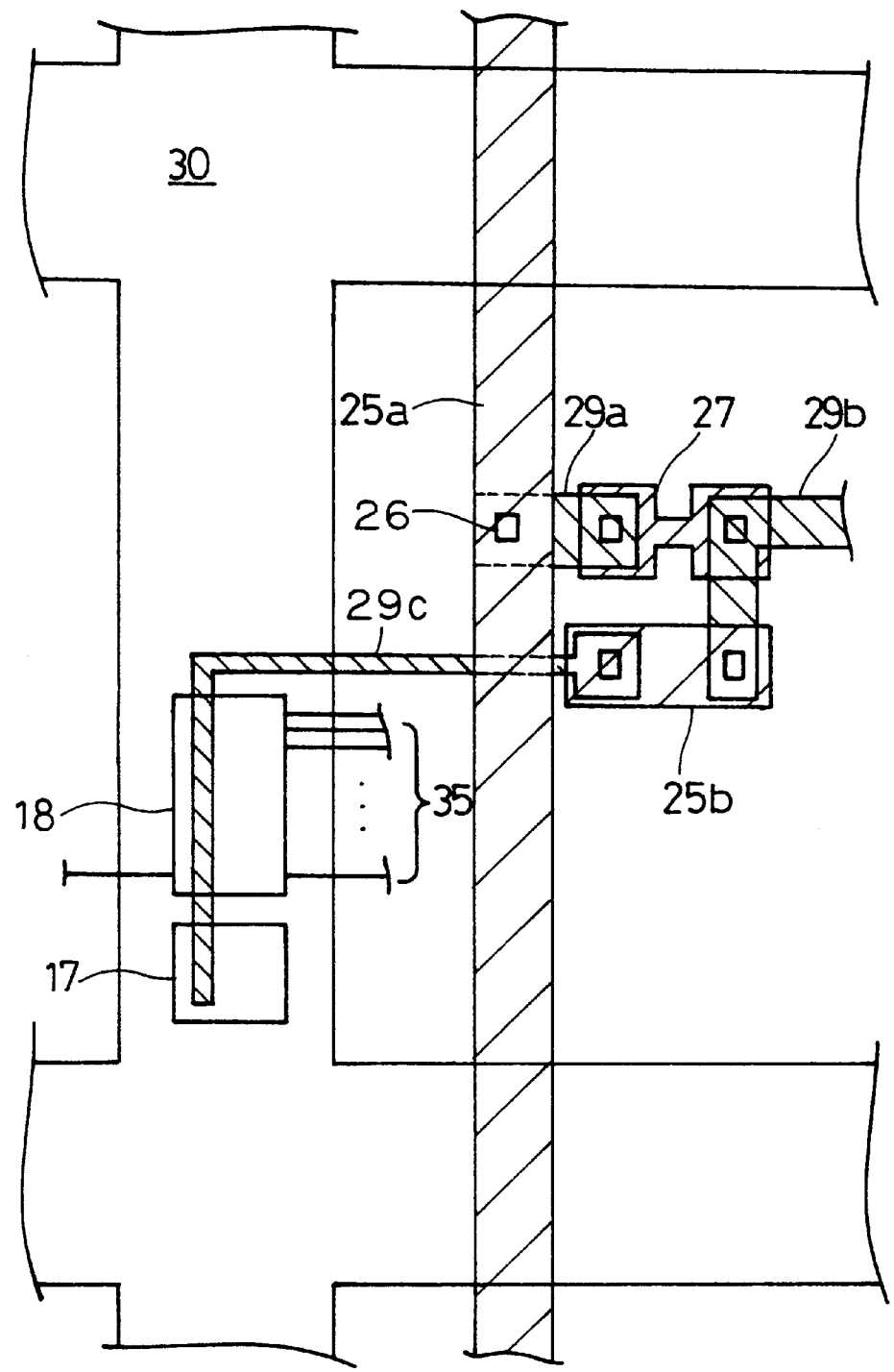
FIGS. 10, 11 and 12 are plan views showing a sixth preferred embodiment according to the present invention.

FIG. 10 is an enlarged diagram showing the contact hole 26 and its surroundings of the semiconductor wafer according to the present invention. A structure shown in FIG. 10 is that which the oscillator 17 and the waveform generator 18 are applied on the dicing line 30. They are connected via the wirings 25b and 29c to the wiring 29b. The wirings 25b and 29c are arranged to supply power to the oscillator 17 and the waveform generator 18.

The semiconductor wafer 24 is subjected to dynamic burn-in in chips provided therein as described in the second preferred embodiment in the state of chip, that is, without being packaged.

The oscillator 17 and the waveform generator 18 are needless in an ordinary operation, and they may dissipate after the burn-in is completed. Thus, they are positioned in the dicing line 30 or the part which are to be cut away later, so that a reduction of IC integration can be avoided.

In this embodiment, also, trimming the fuse 27, undesirable short-circuit which is caused by the wiring 25a exposed by cutting the dicing line 30 can be avoided.

Moreover, providing the fuse 27 at an output terminal 35 of the waveform generator and in the course of the wiring 29c, undesirable short-circuit which is caused by those wirings exposed by cutting the dicing line 30 can be avoided.

Figure 11:
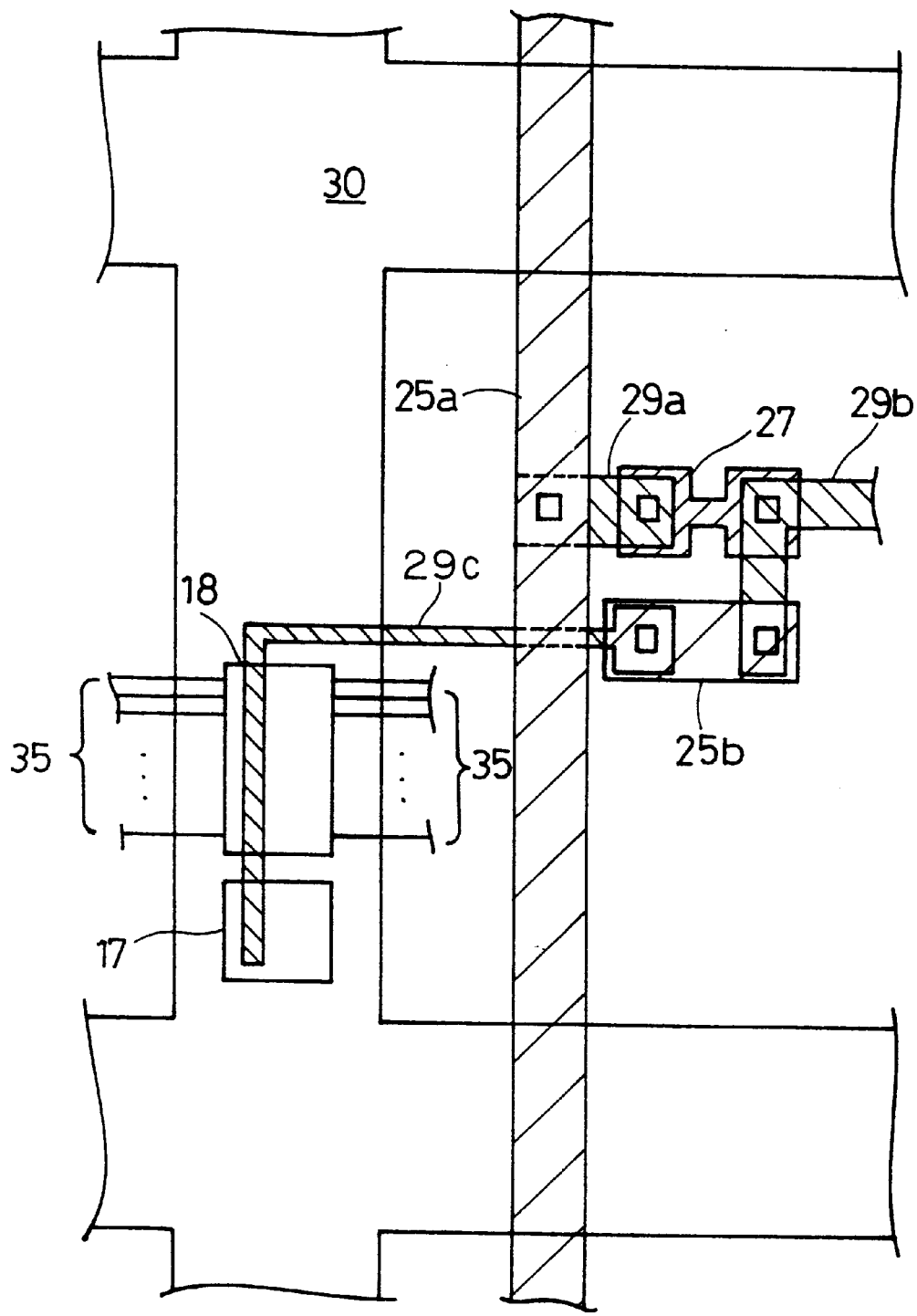

In this way, providing the oscillator 17 and the waveform generator 18 in the dicing line 30, effects described below can further be obtained. For example, as shown in FIG. 11, the waveform generator 18 provided in the dicing line 30 can transmit a specified a.c. signal via the dicing line 30 to a plurality of ICs adjacent to each other.

Figure 12:
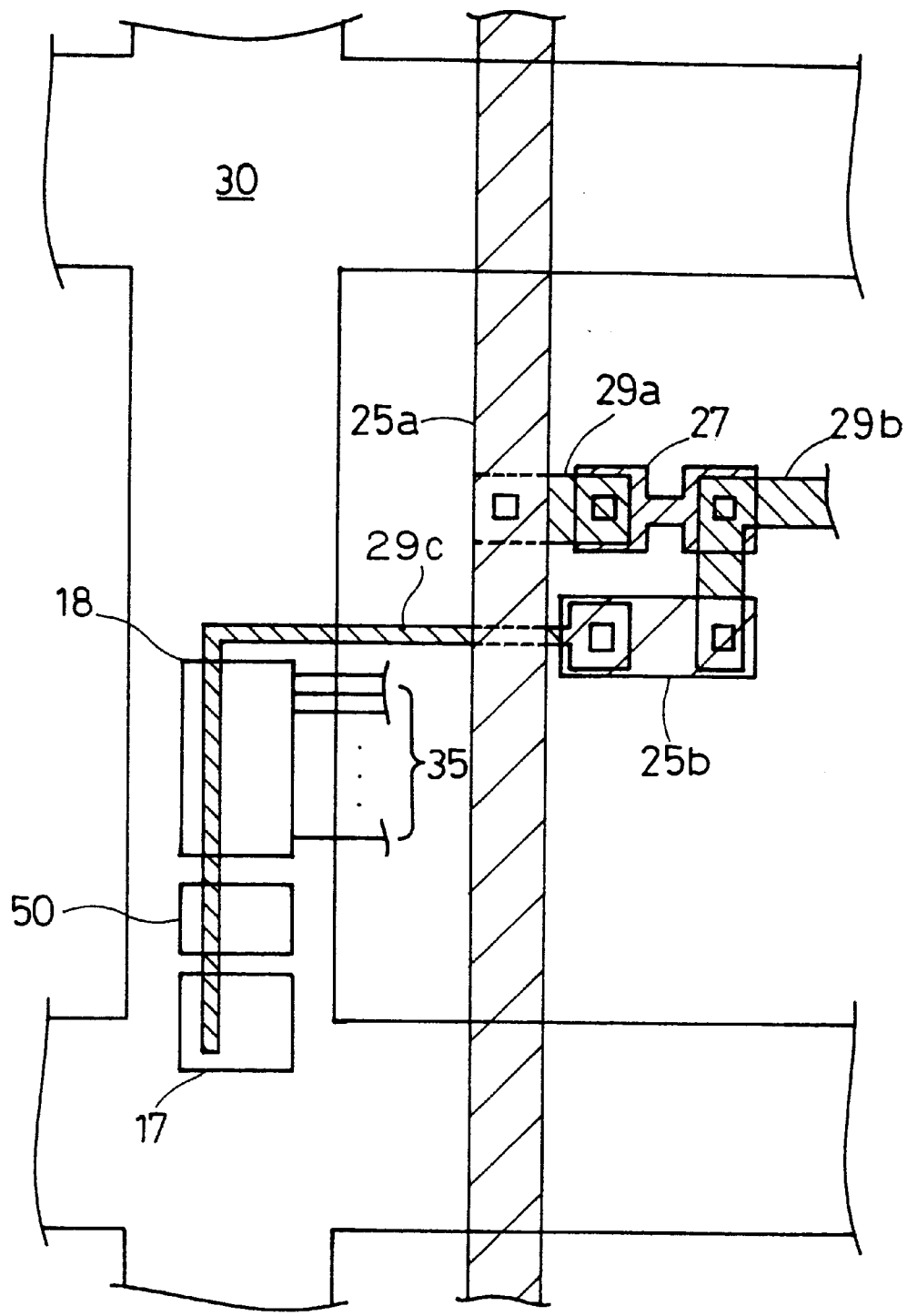

Also, as shown in FIG. 12, it is also possible to provide a check circuit 50 in the dicing line 30, and dynamic burn-in can be performed without degradation of integration.

7th Preferred Embodiment

Figure 13:
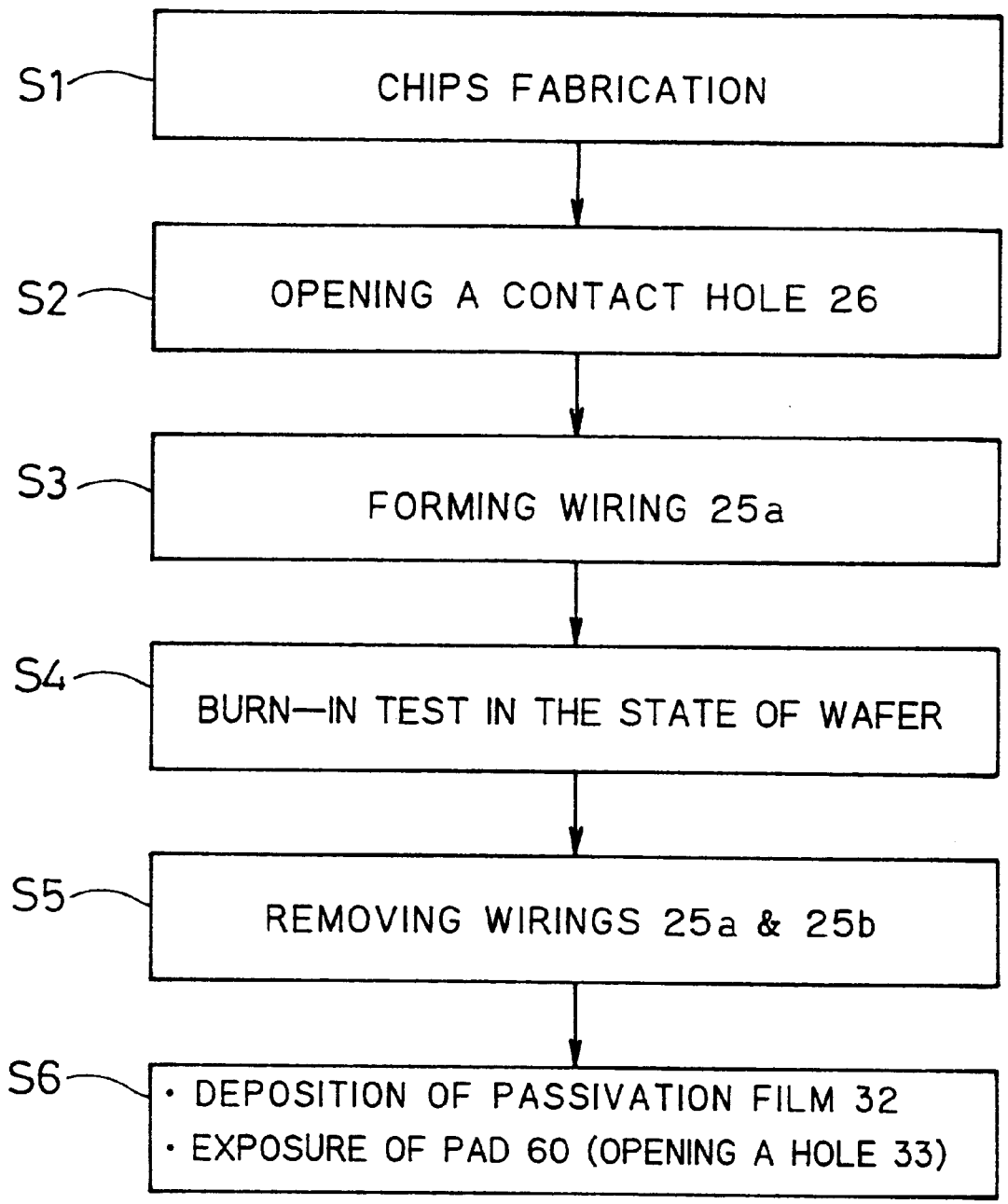
FIG. 13 is a flow chart showing a seventh preferred embodiment according to the present invention.

FIG. 13 is a flow chart illustrating a manufacturing method of a semiconductor wafer according to the present invention. Process steps of manufacturing the semiconductor wafer are explained in order corresponding to FIGS. 14 through 18.

Figure 14:
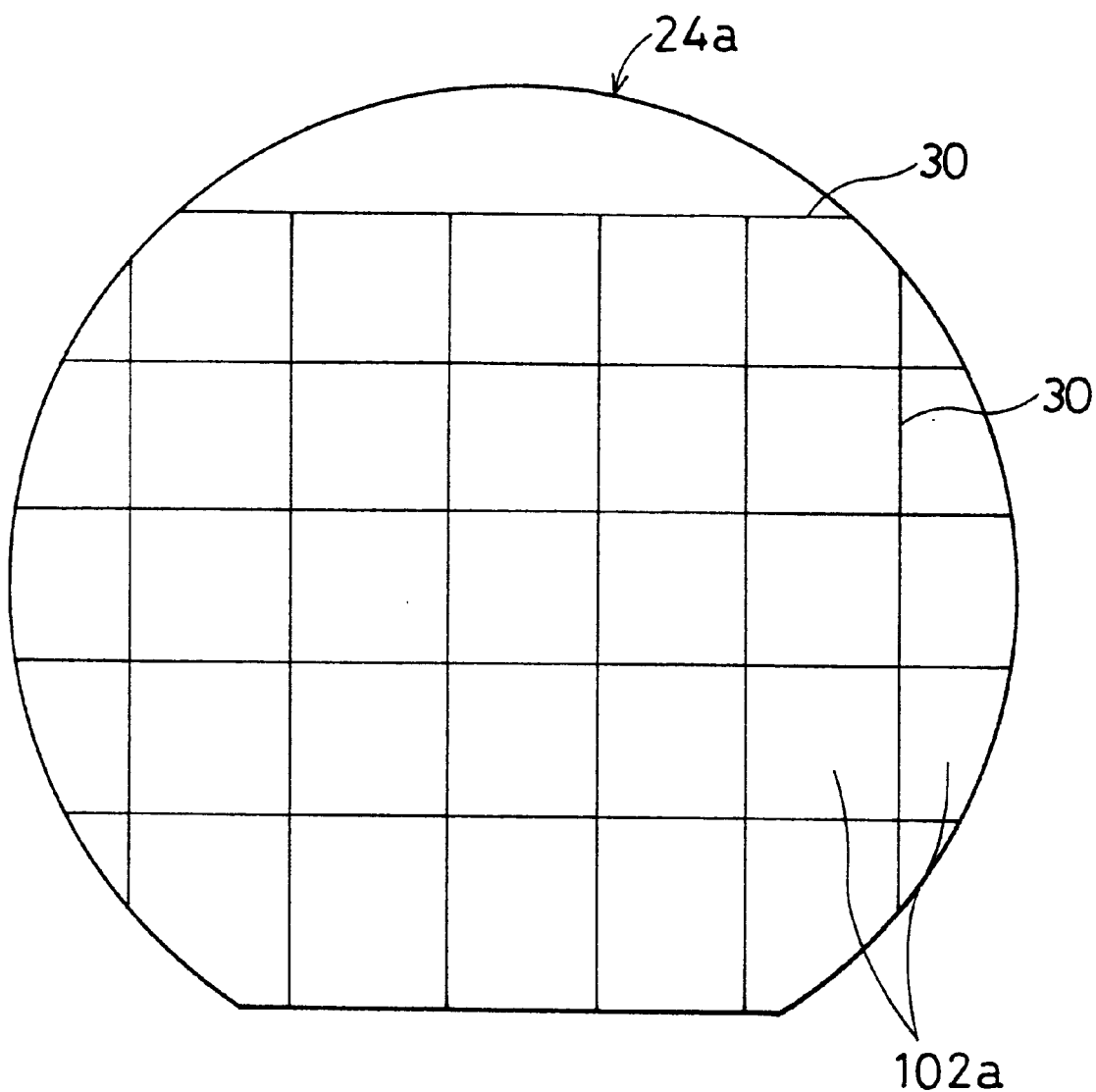
FIG. 14 is a plan view showing the seventh preferred embodiment according to the present invention.
Figure 15:
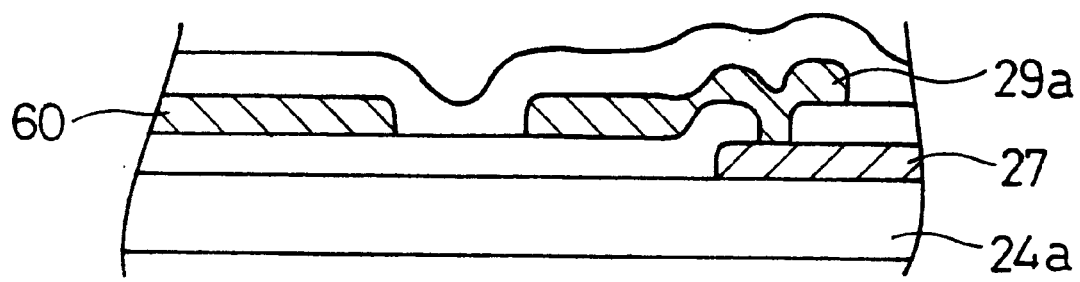
FIGS. 15 through 18 are sectional views showing process steps of the seventh preferred embodiment according to the present invention in order.

First, chips having a structure required for conducting an ordinary operation are fabricated (Step S1). For example, as shown in FIG. 14, the dicing line 30 is formed in the substrate 24a, and the ICs 102a are made sectioned by the dicing line 30. Each of the ICs 102a is provided with the pad 60, the wiring 29a and fuse 27. This is shown in a sectional view of FIG. 15.

Figure 16:
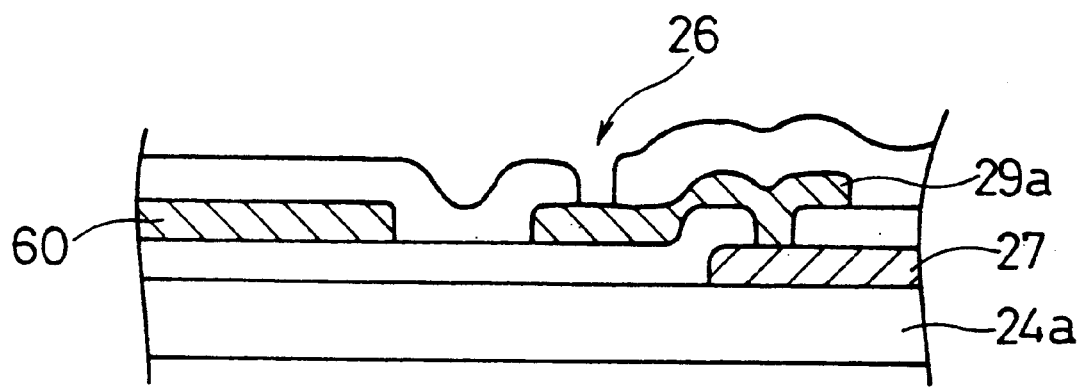
Figure 17:
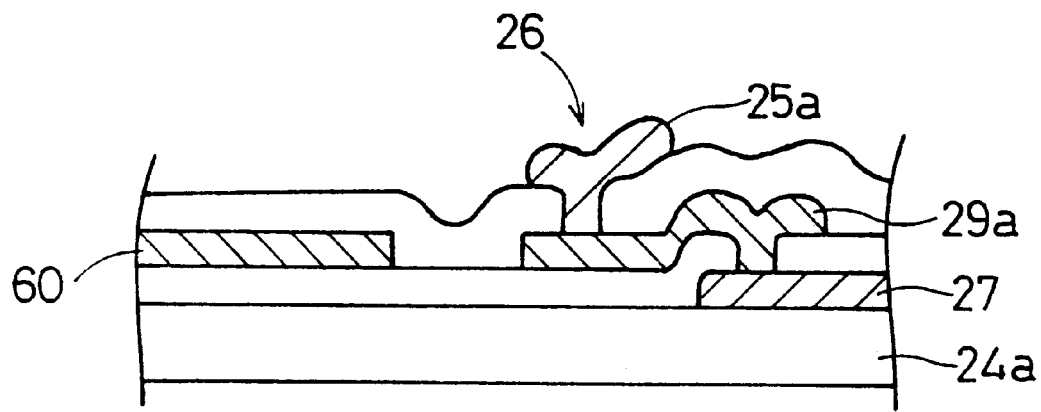

Then, as shown in FIG. 16, the contact hole 26 is opened to expose part of the wiring 29a (Step S2). After that, as shown in FIG. 17, the wiring 25a is formed in the contact hole 26 (Step S3). As described in the fifth and sixth preferred embodiments, burn-in is practiced in this situation (Step S4).

Figure 18:
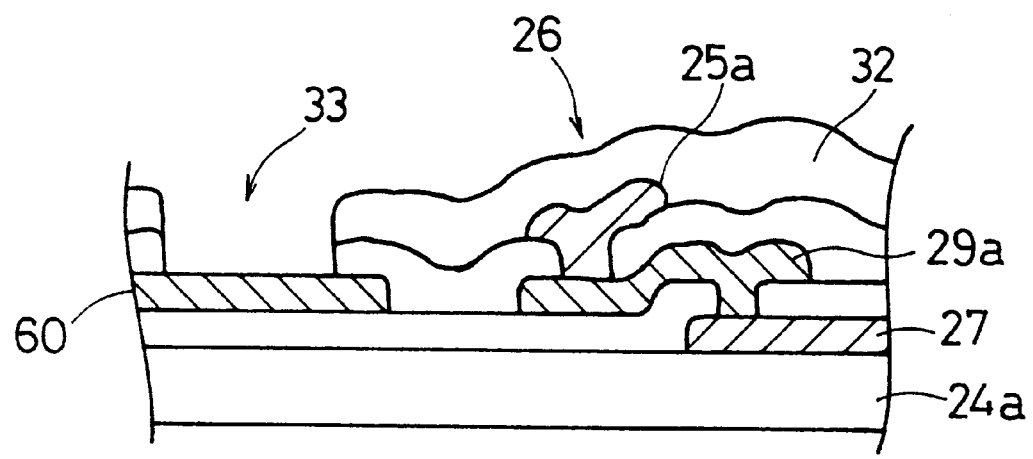

After that, the wiring 25a is selectively removed (Step S5), a passivation film 32 is deposited as shown in FIG. 18, and a hole 33 is made to expose the pad 60 (Step S6). After that, the semiconductor wafer 24 is cut along the dicing line 30.

Figure 19:
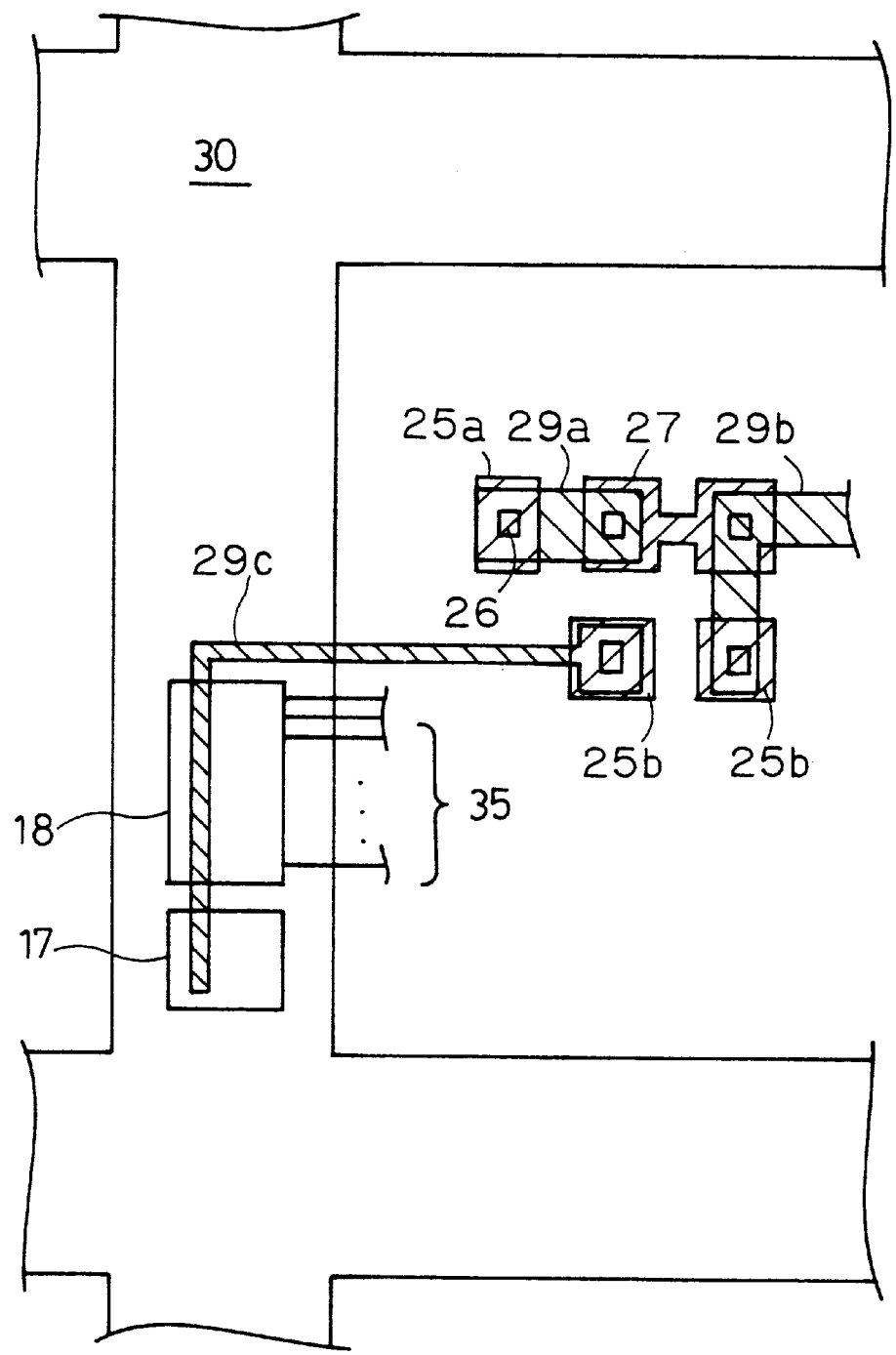
FIG. 19 is a plan view showing the seventh preferred embodiment according to the present invention.

In the seventh preferred embodiment, since the wirings 25a and 25b are selectively removed, undesirable short-circuit which is caused by those wirings exposed by cutting the dicing line 30 can be avoided without trimming the fuse 27. However, as shown in FIG. 18, the wirings 25a and 25b must remain in the vicinity of the contact hole 26 to fill the contact hole 26. FIG. 19 is a plan view showing the wirings 25a and 25b remaining

8th Preferred Embodiment

Figure 20:
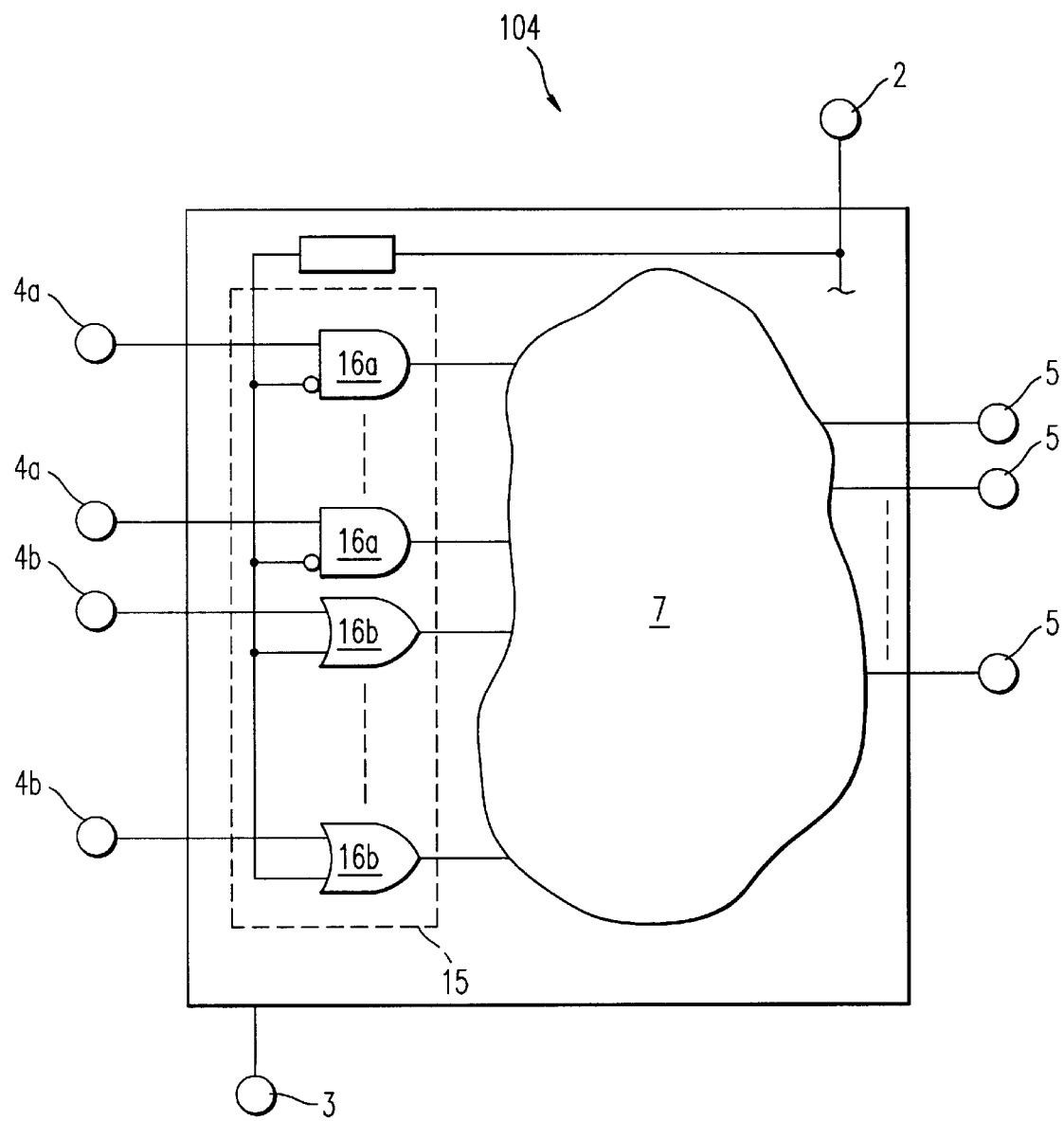
FIG. 20 is a block diagram showing a eighth preferred embodiment according to the present invention.
Figure 21:
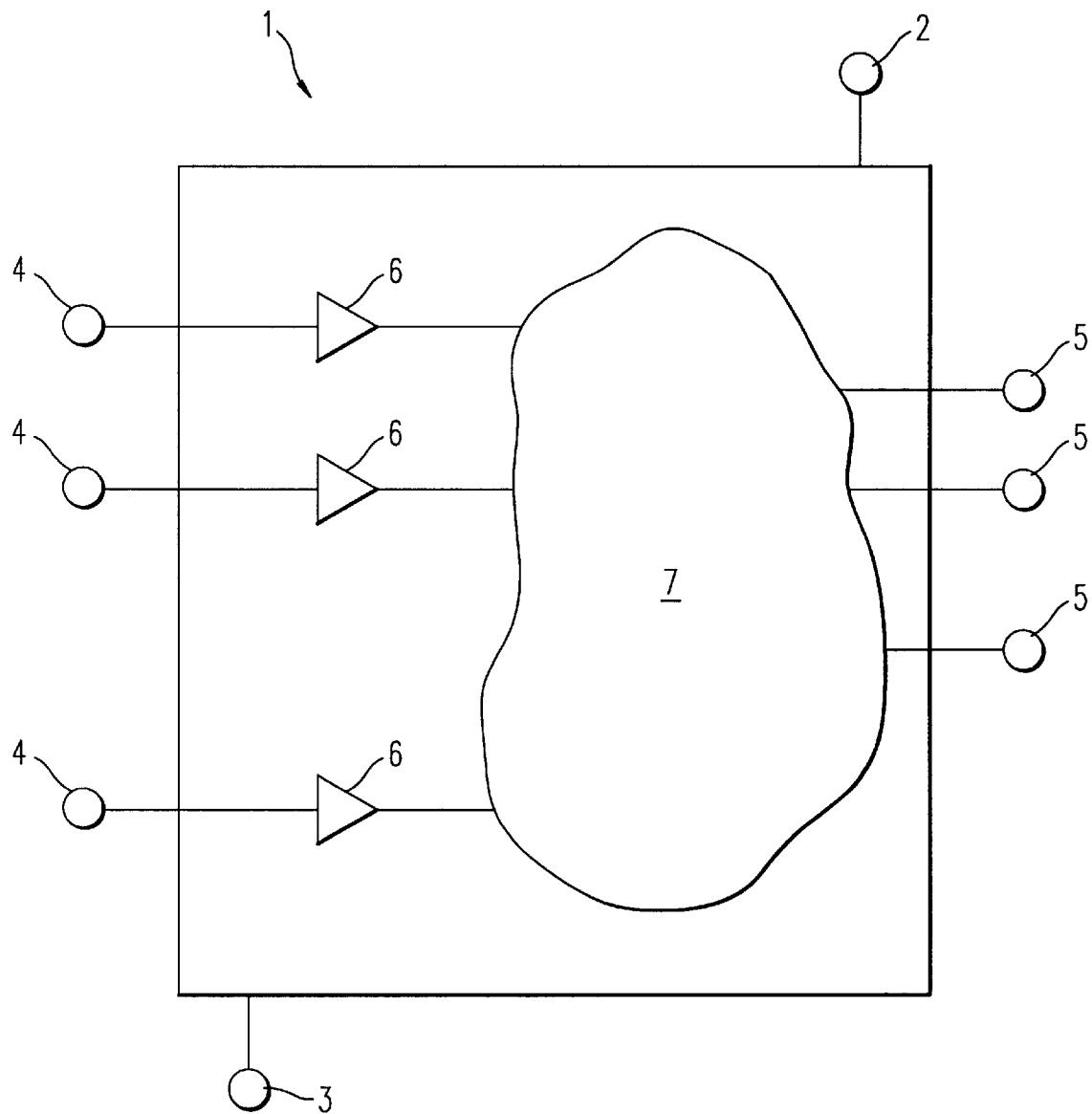
FIGS. 21, 22 and 23 are block diagrams showing a prior art technology.
Figure 22:
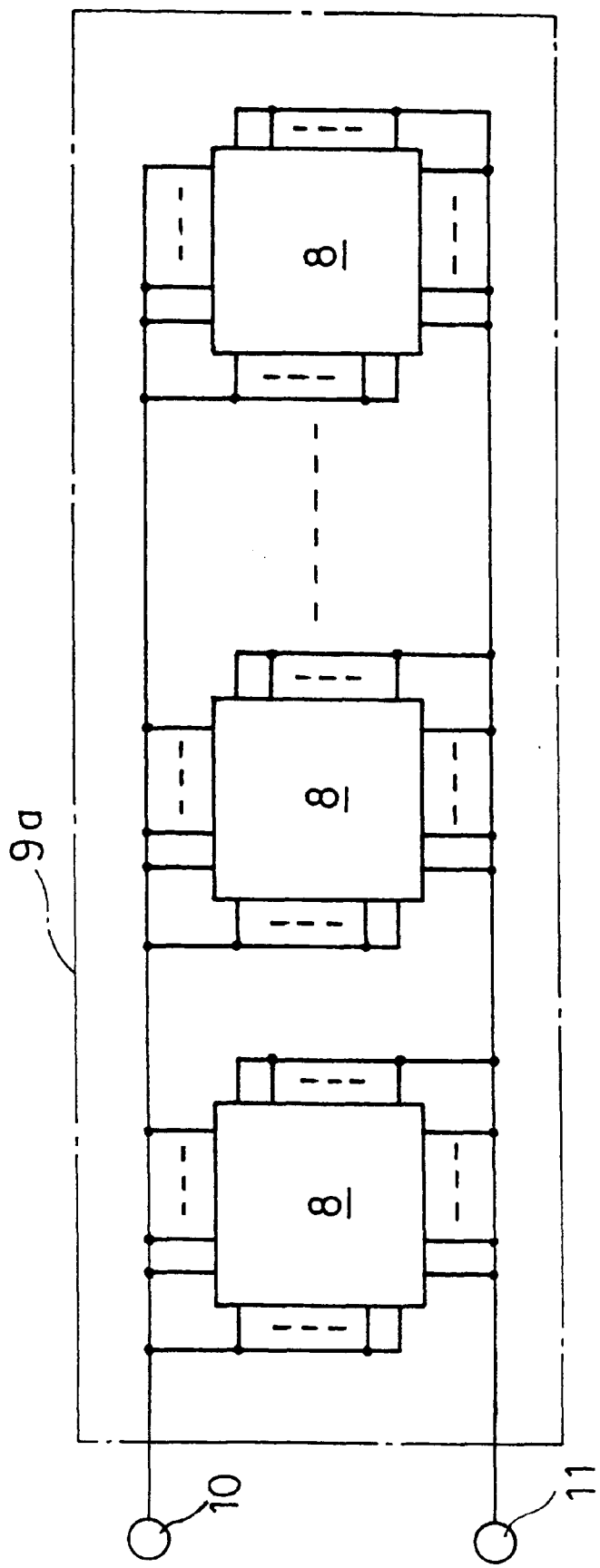
Figure 23:
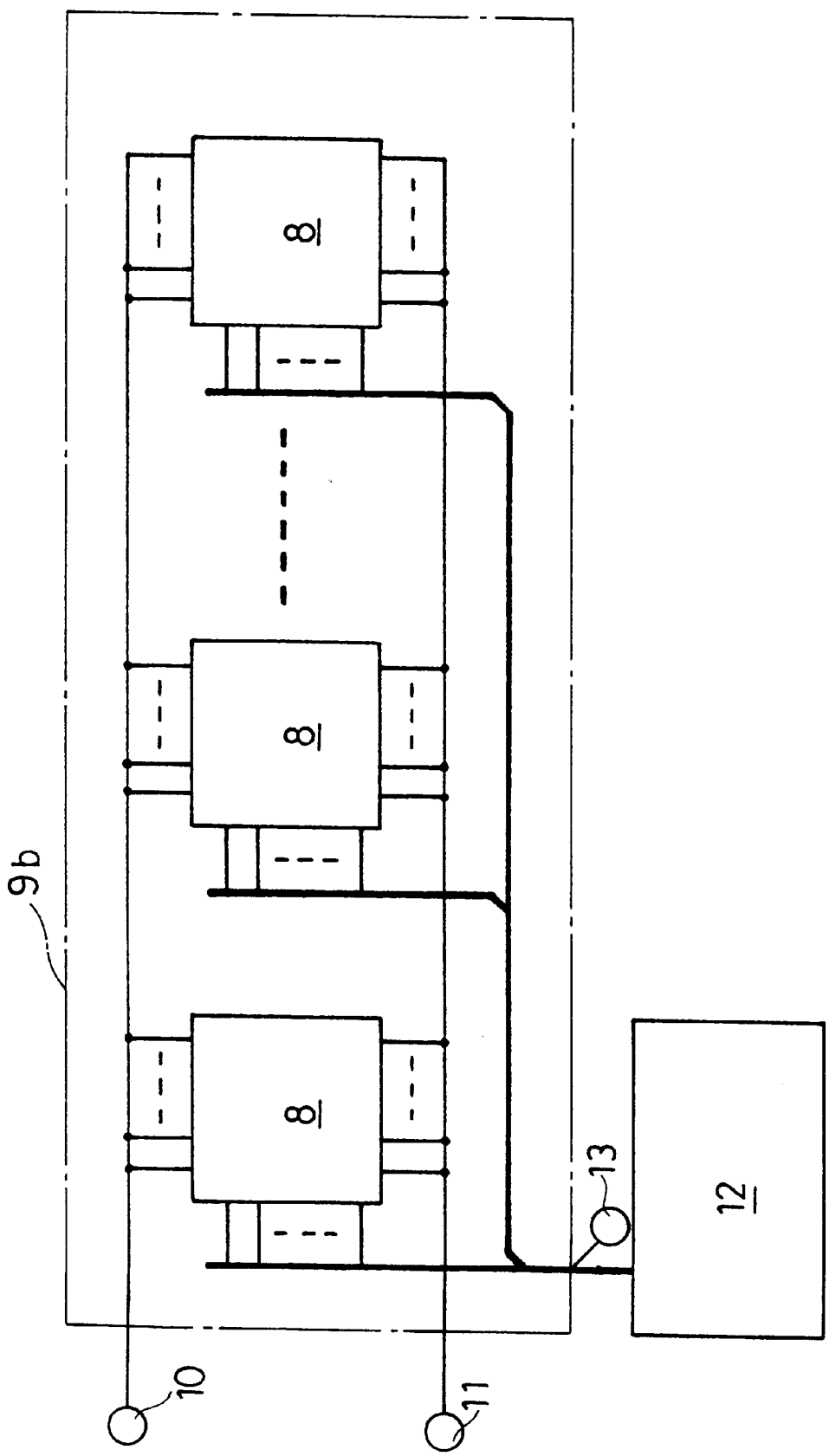

FIG. 20 is a block diagram showing a structure of an IC104 of a semiconductor device according to the present invention. The 1C104 has a voltage detecting circuit 60 added to the IC100 described in the first preferred embodiment. However, the burn-in board setting terminal 14 is not provided.

The voltage detecting circuit 60 is interposed between the VCC terminal 2 and the mode switching circuit 15, and a test signal is applied to the mode switching circuit 15 in accordance with a potential applied to the VCC terminal 2. As has been described, in executing burn-in, voltage higher than the potential difference applied in ordinary use to the VCC terminal 2 and the GND terminal 3 is applied between them. Thus, also in practicing burn-in, when a potential applied to the GND terminal is the same as that in the ordinary operation (e.g., the earth), potential applied to the VCC terminal 2 in executing the burn-in is higher than that applied to the VCC terminal 2 in the ordinary operation.

The voltage detecting circuit 60 detects the difference between those potentials, and a test signal Low is applied to the mode switching circuit 15 if it is judged that is in the ordinary operation, or otherwise a test signal High is applied to the mode switching circuit 15 if it is judged in burn-in.

In this way, the IC104 is operative without the burn-in board setting terminal 14, and a burn-in board used in burn-in can be standardized as in the first preferred embodiment.

While the invention has been shown and described in detail, the foregoing description is in all aspects illustrative and not restrictive. It is therefore understood that numerous modifications and variations can be devised without departing from the scope of the invention.

What is claimed is:

1. A test board of a semiconductor device, for conducting a test on a semiconductor device which has (a) a semiconductor circuit which is an object of a test, (b) an input terminal means receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, (e) a test terminal receiving a test signal activated during the test and deactivated during the ordinary operation, (f) a mode switching circuit interposed between the input terminal means and the semiconductor circuit for switching its operation depending upon the test signal, and (g) a fuse for applying the test signal to the mode switching circuit, the mode switching circuit (f-1) applying the input signal received on the input terminal means to the semiconductor circuit during the ordinary operation, and (f-2) applying at least one specified fixed value to the semiconductor circuit during the test, the test board comprising a test power terminal for applying a test potential only to the power terminal and the test terminal.

2. A test board of a semiconductor device, for conducting a test on a semiconductor device which has (a) a semiconductor circuit which is an object of a test, (b) an input terminal means receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, (e) a mode switching circuit interposed between the input terminal means and the semiconductor circuit and receiving a test signal to be activated during the test and deactivated during the ordinary operation, for switching its operation depending upon the test signal, and (f) a fuse for applying the test signal to the mode switching circuit, the mode switching circuit (e-1) applying the input signal received on the input terminal means to the semiconductor circuit during the ordinary operation, and (e-2) applying a specified fixed value to the semiconductor circuit during the test, the test board of the semiconductor device comprising a test power terminal for applying a test potential only to the power terminal.

3. A semiconductor device comprising (a) a semiconductor circuit which is an object of a test, (b) an input terminal means receiving an input signal to the semiconductor circuit during an ordinary operation, (c) an output terminal receiving an output signal from the semiconductor circuit during the ordinary operation, (d) a power terminal applying a specified potential to the semiconductor circuit during the ordinary operation, and (e) a mode switching circuit interposed between the input terminal means and the semiconductor circuit for switching its operation from the test to the ordinary operation; wherein the mode switching circuit (e-1) applies the input signal received on the input terminal to the semiconductor circuit during the ordinary operation and (e-2) applies at least one specified fixed value to the semiconductor circuit during the test and, wherein the mode switching circuit receives a test signal which is activated during the test and deactivated during the ordinary operation, wherein the input terminal includes first and second input terminals, and wherein the at least one specified fixed value includes first and second fixed values, the mode switching circuit includes a first gate for outputting the second fixed value regardless of a value of a signal applied to the first input terminal during the test and a second gate for outputting the first fixed value regardless of a value of a signal applied to the second input terminal during the test and wherein the test signal takes the first fixed value when activated or otherwise take the second fixed value when deactivated wherein the first and second fixed values corresponds to logical values "1" and "0", respectively, and wherein the first gate includes a first input end connected to the first input terminal, a second input end receiving the test signal, and an output end outputting a logical product of a logic value applied to the first input end thereof and an inverted logic value of the test signal to the semiconductor circuit, and the second gate includes a first input end connected to the second input terminal, a second input end receiving the test signal, and an output end outputting a logical sum of logic values of the first and second input ends thereof to the semiconductor circuit.

4. A semiconductor device according to claim 3, wherein the input terminal means further includes a third input terminal; and the semiconductor device further comprises (f) signal generating means interposed between the third input terminal and the semiconductor circuit, for outputting a specified a.c. signal regardless of a value of a signal applied to the third input terminal during the test.

5. A semiconductor device according to claim 4, wherein the signal generating means includes
   (f-1) a waveform generator for outputting the specified a.c. signal, and
   (f-2) a selector connected to the waveform generator and receiving the test signal, for applying output from the waveform generator to the semiconductor circuit when the test signal is activated or otherwise applying a signal received on the third input terminal when the test signal is deactivated.

6. A semiconductor device according to claim 5, wherein the signal generating means further includes
   (f-3) an oscillator for applying to the waveform generator a basic signal which is a base of the specified a.c. signal during the test.

7. A semiconductor device according to claim 6, wherein the waveform generator includes a read only memory therein.

8. A semiconductor device according to claim 6, wherein the signal generating means further includes
   (f-4) confirming means connected between the oscillator and the waveform generator for confirming operations of the oscillator and the waveform generator.

9. A semiconductor device according to claim 8, wherein the confirming means includes
   (f-4-1) a first confirming unit for confirming the operation of the waveform generator, and
   (f-4-2) a second confirming unit for confirming the operation of the oscillator.

10. A semiconductor device according to claim 9, wherein the first confirming unit (f-4-1-1) applies output of the oscillator to the waveform generator when the test signal is activated and
(f-4-1-2) has an external signal terminal for applying an external signal from the outside to the waveform generator when the test signal is deactivated;
the waveform generator including a first monitor terminal on which output based upon the external signal is applied.

11. A semiconductor device according to claim 10, wherein the second confirming unit includes
   (f-4-2-1) a shift register for sequentially storing outputs of the oscillator when the test signal is activated, and
   (f-4-2-2) a second monitor terminal for confirming output of the shift register.

12. A semiconductor device according to claim 11, wherein the test is burn-in.

13. A semiconductor device according to claim 10, further comprising (g) a first fuse connected to the power terminal.

14. A semiconductor device according to claim 13, further comprising (h) second fuse connected to the mode switching circuit for allowing the test signal to flow therein.

15. A semiconductor device according to claim 14, further comprising
   (i) a first wiring connected to the second fuse, and
   (j) a second wiring for transmitting the test signal to the first wiring.

16. A semiconductor device according to claim 1, wherein the power terminal applies to the semiconductor circuit during the test, a potential different from the specified potential,
   the semiconductor device further comprising (f) a voltage detecting circuit connected to the power terminal for outputting the test signal of which activation/deactivation depends upon a potential of the power terminal.

17. A semiconductor device according to claim 1 further comprising (f) a test terminal receiving the test signal.

18. A semiconductor wafer comprising
   (a) a plurality of semiconductor devices each of which has
      (a-1) a semiconductor circuit which is an object of a test,
      (a-2) an input terminal means receiving an input signal to the semiconductor circuit during an ordinary operation,
      (a-3) an output terminal receiving an output signal from the semiconductor circuit during the ordinary operation,
      (a-4) a power terminal applying a specified potential to the semiconductor circuit during the ordinary operation,
      (a-5) a mode switching circuit interposed between the input terminal means and the semiconductor circuit and receiving a test signal activated during the test and deactivated during the ordinary operation, for switching its operation depending upon the test signal, and
      (a-6) a first wiring for applying the test signal to the mode switching circuit, and
   (b) a second wiring commonly connecting the first wirings of the plurality of semiconductor devices, wherein the mode switching circuit applies
      (a-5-1) the input signal received on the input terminal to the semiconductor circuit during the ordinary operation,
      (a-5-2) at least one specified fixed value to the semiconductor circuit during the test, wherein the input terminal means includes an a.c. signal terminal, the semiconductor wafer further comprising
- (c) dicing line separating the plurality of semiconductor devices from each other, and
- (d) signal generating means interposed between the a.c. signal terminal and the semiconductor circuit, outputting a specified a.c. signal regardless of a value of a signal applied to the a.c. signal terminal during the test, and formed in the dicing line.

19. A semiconductor wafer according to claim 18, wherein the first wiring includes a first fuse.

20. A semiconductor wafer according to claim 19, further comprising (e) a second fuse interposed between the signal generating means and the semiconductor circuit.

21. A semiconductor wafer according to claim 19, wherein the signal generating means includes
- (d-1) a waveform generator for outputting the specified a.c. signal, and
- (d-2) a selector connected to the waveform generator, receiving the test signal, applying to the semiconductor circuit output of the waveform generator when the test signal is activated, and a signal applied to the a.c. signal terminal when the test signal is deactivated, respectively.

22. A semiconductor wafer according to claim 21, wherein the signal generating means further includes
- (d-3) an oscillator for applying a basic signal which is a base of the specified a.c. signal, to the waveform generator during the test.

23. A semiconductor wafer according to claim 22, wherein the signal generating means further includes
- (d-4) confirming means connected between the oscillator and the waveform generator for confirming operations of the oscillator and the waveform generator.

* * * * *